US 7,808,818 B2

(12) United States Patent
Eitan

(10) Patent No.: US 7,808,818 B2
(45) Date of Patent: Oct. 5, 2010

(54) SECONDARY INJECTION FOR NROM

(75) Inventor: Boaz Eitan, Ra'anana (IL)

(73) Assignee: Saifun Semiconductors Ltd., Netanya (IL)

( * ) Notice: Subject to any disclaimer, the term of this patent is extended or adjusted under 35 U.S.C. 154(b) by 663 days.

(21) Appl. No.: 11/646,395

(22) Filed: Dec. 28, 2006

(65) Prior Publication Data

US 2007/0159880 A1    Jul. 12, 2007

Related U.S. Application Data

(60) Provisional application No. 60/758,204, filed on Jan. 12, 2006, provisional application No. 60/773,643, filed on Feb. 16, 2006, provisional application No. 60/777,238, filed on Feb. 28, 2006, provisional application No. 60/777,111, filed on Feb. 28, 2006.

(51) Int. Cl.
*G11C 16/04* (2006.01)

(52) U.S. Cl. .............................. 365/185.03; 365/185.24
(58) Field of Classification Search ............ 365/185.03, 365/185.24, 185.27
See application file for complete search history.

(56) References Cited

U.S. PATENT DOCUMENTS

| | | | |
|---|---|---|---|
| 3,881,180 A | 4/1975 | Gosney, Jr. |
| 3,895,360 A | 7/1975 | Cricchi et al. |
| 3,952,325 A | 4/1976 | Beale et al. |
| 4,016,588 A | 4/1977 | Ohya et al. |
| 4,017,888 A | 4/1977 | Christie et al. |
| 4,145,703 A | 3/1979 | Blanchard et al. |
| 4,151,021 A | 4/1979 | McElroy |
| 4,173,766 A | 11/1979 | Hayes |
| 4,173,791 A | 11/1979 | Bell |
| 4,247,861 A | 1/1981 | Hsu et al. |
| 4,257,832 A | 3/1981 | Schwabe et al. |
| 4,281,397 A | 7/1981 | Neal et al. |
| 4,306,353 A | 12/1981 | Jacobs et al. |
| 4,342,102 A | 7/1982 | Puar |
| 4,342,149 A | 8/1982 | Jacobs et al. |
| 4,360,900 A | 11/1982 | Bate |
| 4,373,248 A | 2/1983 | McElroy |
| 4,380,057 A | 4/1983 | Kotecha et al. |
| 4,388,705 A | 6/1983 | Sheppard |
| 4,389,705 A | 6/1983 | Sheppard |
| 4,404,747 A | 9/1983 | Collins |

(Continued)

FOREIGN PATENT DOCUMENTS

EP    0 656 628    6/1995

(Continued)

OTHER PUBLICATIONS

U.S. Appl. No. 08/902,890, filed Jul. 30, 1997, Eitan.

(Continued)

*Primary Examiner*—Vu A Le
(74) *Attorney, Agent, or Firm*—Eitan Mehulal Law Group

(57) ABSTRACT

Secondary electron injection (SEI) is used for programming NVM cells having separate charge storage areas in an ONO layer, such as NROM cells. Various combinations of low wordline voltage (Vwl), negative substrate voltabe (Vb), and shallow and deep implants facilitate the process. Second bit problems may be controlled, and retention and punchthrough may be improved. Lower SEI programming current may result in relaxed constraints on bitine resistance, number of contacts required, and power supply requirements.

31 Claims, 5 Drawing Sheets

U.S. PATENT DOCUMENTS

| | | |
|---|---|---|
| 4,435,786 A | 3/1984 | Tickle |
| 4,448,400 A | 5/1984 | Harari |
| 4,471,373 A | 9/1984 | Shimizu et al. |
| 4,494,016 A | 1/1985 | Ransom et al. |
| 4,507,673 A | 3/1985 | Aoyama |
| 4,521,796 A | 6/1985 | Rajkanan et al. |
| 4,527,257 A | 7/1985 | Cricchi |
| 4,586,163 A | 4/1986 | Koike |
| 4,613,956 A | 9/1986 | Paterson et al. |
| 4,630,085 A | 12/1986 | Koyama |
| 4,663,645 A | 5/1987 | Komori et al. |
| 4,665,426 A | 5/1987 | Allen et al. |
| 4,667,217 A | 5/1987 | Janning |
| 4,672,409 A | 6/1987 | Takei et al. |
| 4,725,984 A | 2/1988 | Ip et al. |
| 4,733,105 A | 3/1988 | Shin et al. |
| 4,742,491 A | 5/1988 | Liang et al. |
| 4,758,869 A | 7/1988 | Eitan et al. |
| 4,760,555 A | 7/1988 | Gelsomini et al. |
| 4,761,764 A | 8/1988 | Watanabe |
| 4,769,340 A | 9/1988 | Chang et al. |
| 4,780,424 A | 10/1988 | Holler et al. |
| 4,839,705 A | 6/1989 | Tigelaar et al. |
| 4,847,808 A | 7/1989 | Kobatake |
| 4,857,770 A | 8/1989 | Partovi et al. |
| 4,870,470 A | 9/1989 | Bass, Jr. et al. |
| 4,888,735 A | 12/1989 | Lee et al. |
| 4,916,671 A | 4/1990 | Ichiguchi |
| 4,941,028 A | 7/1990 | Chen et al. |
| 4,961,010 A | 10/1990 | Davis |
| 4,992,391 A | 2/1991 | Wang |
| 5,021,999 A | 6/1991 | Kohda et al. |
| 5,027,321 A | 6/1991 | Park |
| 5,029,063 A | 7/1991 | Lingstaedt et al. |
| 5,042,009 A | 8/1991 | Kazerounian et al. |
| 5,075,245 A | 12/1991 | Woo et al. |
| 5,081,371 A | 1/1992 | Wong |
| 5,086,325 A | 2/1992 | Schumann et al. |
| 5,094,968 A | 3/1992 | Schumann et al. |
| 5,104,819 A | 4/1992 | Freiberger et al. |
| 5,117,389 A | 5/1992 | Yiu |
| 5,120,672 A | 6/1992 | Mitchell et al. |
| 5,142,495 A | 8/1992 | Canepa |
| 5,142,496 A | 8/1992 | Van Buskirk |
| 5,159,570 A | 10/1992 | Mitchell et al. |
| 5,168,334 A | 12/1992 | Mitchell et al. |
| 5,172,338 A | 12/1992 | Mehrotra et al. |
| 5,175,120 A | 12/1992 | Lee |
| 5,204,835 A | 4/1993 | Eitan |
| 5,214,303 A | 5/1993 | Aoki |
| 5,237,213 A | 8/1993 | Tanoi |
| 5,241,497 A | 8/1993 | Komarek |
| 5,260,593 A | 11/1993 | Lee |
| 5,268,861 A | 12/1993 | Hotta |
| 5,276,646 A | 1/1994 | Kim et al. |
| 5,280,420 A | 1/1994 | Rapp |
| 5,289,412 A | 2/1994 | Frary et al. |
| 5,293,563 A | 3/1994 | Ohta |
| 5,295,092 A | 3/1994 | Hotta et al. |
| 5,295,108 A | 3/1994 | Higa |
| 5,305,262 A | 4/1994 | Yoneda |
| 5,311,049 A | 5/1994 | Tsuruta |
| 5,315,541 A | 5/1994 | Harari et al. |
| 5,324,675 A | 6/1994 | Hayabuchi |
| 5,334,555 A | 8/1994 | Sugiyama et al. |
| 5,335,198 A | 8/1994 | Van Buskirk et al. |
| 5,338,954 A | 8/1994 | Shimoji |
| 5,345,425 A | 9/1994 | Shikatani |
| 5,349,221 A | 9/1994 | Shimoji |
| 5,350,710 A | 9/1994 | Hong et al. |
| 5,352,620 A | 10/1994 | Komori et al. |
| 5,357,134 A | 10/1994 | Shimoji |
| 5,359,554 A | 10/1994 | Odake et al. |
| 5,361,343 A | 11/1994 | Kosonocky et al. |
| 5,366,915 A | 11/1994 | Kodama |
| 5,369,615 A | 11/1994 | Harari et al. |
| 5,375,094 A | 12/1994 | Naruke |
| 5,381,374 A | 1/1995 | Shiraishi et al. |
| 5,393,701 A | 2/1995 | Ko et al. |
| 5,394,355 A | 2/1995 | Uramoto et al. |
| 5,399,891 A | 3/1995 | Yiu et al. |
| 5,400,286 A | 3/1995 | Chu et al. |
| 5,402,374 A | 3/1995 | Tsuruta et al. |
| 5,412,601 A | 5/1995 | Sawada et al. |
| 5,414,693 A | 5/1995 | Ma et al. |
| 5,418,176 A | 5/1995 | Yang et al. |
| 5,418,743 A | 5/1995 | Tomioka et al. |
| 5,422,844 A | 6/1995 | Wolstenholme et al. |
| 5,424,567 A | 6/1995 | Chen |
| 5,424,978 A | 6/1995 | Wada et al. |
| 5,426,605 A | 6/1995 | Van Berkel et al. |
| 5,428,621 A | 6/1995 | Mehrotra et al. |
| 5,434,825 A | 7/1995 | Harari et al. |
| 5,436,478 A | 7/1995 | Bergemont et al. |
| 5,436,481 A | 7/1995 | Egawa et al. |
| 5,440,505 A | 8/1995 | Fazio et al. |
| 5,450,341 A | 9/1995 | Sawada et al. |
| 5,450,354 A | 9/1995 | Sawada et al. |
| 5,455,793 A | 10/1995 | Amin et al. |
| 5,467,308 A | 11/1995 | Chang et al. |
| 5,477,499 A | 12/1995 | Van Buskirk et al. |
| 5,495,440 A | 2/1996 | Asakura |
| 5,496,753 A | 3/1996 | Sakurai et al. |
| 5,508,968 A | 4/1996 | Collins et al. |
| 5,518,942 A | 5/1996 | Shrivastava |
| 5,521,870 A | 5/1996 | Ishikawa |
| 5,523,251 A | 6/1996 | Hong |
| 5,523,972 A | 6/1996 | Rashid et al. |
| 5,530,803 A | 6/1996 | Chang et al. |
| 5,534,804 A | 7/1996 | Woo |
| 5,537,358 A | 7/1996 | Fong |
| 5,544,116 A | 8/1996 | Chao et al. |
| 5,553,018 A | 9/1996 | Wang et al. |
| 5,553,030 A | 9/1996 | Tedrow et al. |
| 5,557,221 A | 9/1996 | Taguchi et al. |
| 5,557,570 A | 9/1996 | Iwahashi |
| 5,559,687 A | 9/1996 | Nicollini et al. |
| 5,563,823 A | 10/1996 | Yiu et al. |
| 5,566,125 A | 10/1996 | Fazio et al. |
| 5,568,085 A | 10/1996 | Eitan et al. |
| 5,579,199 A | 11/1996 | Kawamura et al. |
| 5,581,252 A | 12/1996 | Thomas |
| 5,583,808 A | 12/1996 | Brahmbhatt |
| 5,590,068 A | 12/1996 | Bergemont |
| 5,590,074 A | 12/1996 | Akaogi et al. |
| 5,592,417 A | 1/1997 | Mirabel |
| 5,596,527 A | 1/1997 | Tomioka et al. |
| 5,599,727 A | 2/1997 | Hakozaki et al. |
| 5,600,586 A | 2/1997 | Lee et al. |
| 5,604,804 A | 2/1997 | Micali |
| 5,606,523 A | 2/1997 | Mirabel |
| 5,608,679 A | 3/1997 | Mi et al. |
| 5,612,642 A | 3/1997 | McClinyock |
| 5,617,357 A | 4/1997 | Haddad et al. |
| 5,619,452 A | 4/1997 | Miyauchi |
| 5,623,438 A | 4/1997 | Guritz et al. |
| 5,627,790 A | 5/1997 | Golla et al. |
| 5,633,603 A | 5/1997 | Lee |
| 5,636,288 A | 6/1997 | Bonneville et al. |
| 5,644,531 A | 7/1997 | Kuo et al. |
| 5,650,959 A | 7/1997 | Hayashi et al. |
| 5,654,568 A | 8/1997 | Nakao |
| 5,656,513 A | 8/1997 | Wang et al. |
| 5,657,332 A | 8/1997 | Auclair et al. |

| | | | | | |
|---|---|---|---|---|---|
| 5,661,060 A | 8/1997 | Gill et al. | 5,933,366 A | 8/1999 | Yoshikawa |
| 5,663,907 A | 9/1997 | Frayer et al. | 5,933,367 A | 8/1999 | Matsuo et al. |
| 5,666,365 A | 9/1997 | Kostreski | 5,936,888 A | 8/1999 | Sugawara |
| 5,672,959 A | 9/1997 | Der | 5,940,332 A | 8/1999 | Artieri |
| 5,675,280 A | 10/1997 | Nomura | 5,946,258 A | 8/1999 | Evertt et al. |
| 5,677,867 A | 10/1997 | Hazani | 5,946,558 A | 8/1999 | Hsu |
| 5,677,869 A | 10/1997 | Fazio et al. | 5,949,714 A | 9/1999 | Hemink et al. |
| 5,683,925 A | 11/1997 | Irani et al. | 5,949,728 A | 9/1999 | Liu et al. |
| 5,689,459 A | 11/1997 | Chang et al. | 5,959,311 A | 9/1999 | Shih et al. |
| 5,694,356 A | 12/1997 | Wong et al. | 5,963,412 A | 10/1999 | En |
| 5,696,929 A | 12/1997 | Hasbun et al. | 5,963,465 A | 10/1999 | Eitan |
| 5,708,608 A | 1/1998 | Park et al. | 5,966,603 A | 10/1999 | Eitan |
| 5,712,814 A | 1/1998 | Fratin et al. | 5,969,989 A | 10/1999 | Iwahashi |
| 5,712,815 A | 1/1998 | Bill et al. | 5,969,993 A | 10/1999 | Takeshima |
| 5,715,193 A | 2/1998 | Norman | 5,973,373 A | 10/1999 | Krautschneider et al. |
| 5,717,581 A | 2/1998 | Canclini | 5,982,666 A | 11/1999 | Campardo |
| 5,717,632 A | 2/1998 | Richart et al. | 5,986,940 A | 11/1999 | Atsumi et al. |
| 5,717,635 A | 2/1998 | Akatsu | 5,990,526 A | 11/1999 | Bez et al. |
| 5,721,781 A | 2/1998 | Deo et al. | 5,991,201 A | 11/1999 | Kuo et al. |
| 5,726,946 A | 3/1998 | Yamagata et al. | 5,991,202 A | 11/1999 | Derhacobian et al. |
| 5,745,410 A | 4/1998 | Yiu et al. | 5,991,517 A | 11/1999 | Harari et al. |
| 5,748,534 A | 5/1998 | Dunlap et al. | 5,999,444 A | 12/1999 | Fujiwara et al. |
| 5,751,037 A | 5/1998 | Aozasa et al. | 5,999,494 A | 12/1999 | Holzrichter |
| 5,751,637 A | 5/1998 | Chen et al. | 6,000,006 A | 12/1999 | Bruce et al. |
| 5,754,475 A | 5/1998 | Bill et al. | 6,005,423 A | 12/1999 | Schultz |
| 5,760,445 A | 6/1998 | Diaz | 6,011,715 A | 1/2000 | Pasotti |
| 5,760,634 A | 6/1998 | Fu | 6,011,725 A | 1/2000 | Eitan |
| 5,768,192 A | 6/1998 | Eitan | 6,018,186 A | 1/2000 | Hsu |
| 5,768,193 A | 6/1998 | Lee et al. | 6,020,241 A | 2/2000 | You et al. |
| 5,771,197 A | 6/1998 | Kim | 6,028,324 A | 2/2000 | Su et al. |
| 5,774,395 A | 6/1998 | Richart et al. | 6,030,871 A | 2/2000 | Eitan |
| 5,777,919 A | 7/1998 | Chi-Yung et al. | 6,034,403 A | 3/2000 | Wu |
| 5,781,476 A | 7/1998 | Seki et al. | 6,034,896 A | 3/2000 | Ranaweera et al. |
| 5,781,478 A | 7/1998 | Takeuchi et al. | 6,037,627 A | 3/2000 | Kitamura et al. |
| 5,783,934 A | 7/1998 | Tran | 6,040,610 A | 3/2000 | Noguchi et al. |
| 5,784,314 A | 7/1998 | Sali et al. | 6,040,996 A | 3/2000 | Kong |
| 5,787,036 A | 7/1998 | Okazawa | 6,044,019 A | 3/2000 | Cernea et al. |
| 5,793,079 A | 8/1998 | Georgescu et al. | 6,044,022 A | 3/2000 | Nachumovsky |
| 5,801,076 A | 9/1998 | Ghneim et al. | 6,063,666 A | 5/2000 | Chang et al. |
| 5,805,500 A | 9/1998 | Campardo et al. | 6,064,226 A | 5/2000 | Earl |
| 5,808,506 A | 9/1998 | Tran | 6,064,251 A | 5/2000 | Park |
| 5,812,449 A | 9/1998 | Song | 6,064,591 A | 5/2000 | Takeuchi et al. |
| 5,812,456 A | 9/1998 | Hull et al. | 6,074,916 A | 6/2000 | Cappelletti |
| 5,812,457 A | 9/1998 | Arase | 6,075,402 A | 6/2000 | Ghilardelli |
| 5,815,435 A | 9/1998 | Van Tran | 6,075,724 A | 6/2000 | Li et al. |
| 5,822,256 A | 10/1998 | Bauer et al. | 6,078,518 A | 6/2000 | Chevallier |
| 5,825,683 A | 10/1998 | Chang et al. | 6,081,456 A | 6/2000 | Dadashev |
| 5,825,686 A | 10/1998 | Schmitt-Landsiedel et al. | 6,084,794 A | 7/2000 | Lu et al. |
| 5,828,601 A | 10/1998 | Hollmer et al. | 6,091,640 A | 7/2000 | Kawahara et al. |
| 5,834,851 A | 11/1998 | Ikeda et al. | 6,094,095 A | 7/2000 | Murray et al. |
| 5,835,935 A | 11/1998 | Estakhri et al. | 6,097,639 A | 8/2000 | Choi et al. |
| 5,836,772 A | 11/1998 | Chang et al. | 6,107,862 A | 8/2000 | Mukainakano et al. |
| 5,841,700 A | 11/1998 | Chang | 6,108,240 A | 8/2000 | Lavi et al. |
| 5,847,441 A | 12/1998 | Cutter et al. | 6,108,241 A | 8/2000 | Chevallier |
| 5,861,771 A | 1/1999 | Matsuda et al. | 6,117,714 A | 9/2000 | Beatty |
| 5,862,076 A | 1/1999 | Eitan | 6,118,207 A | 9/2000 | Ormerod et al. |
| 5,864,164 A | 1/1999 | Wen | 6,118,692 A | 9/2000 | Banks |
| 5,867,429 A | 2/1999 | Chen et al. | 6,122,198 A | 9/2000 | Haddad et al. |
| 5,870,334 A | 2/1999 | Hemink et al. | 6,128,226 A | 10/2000 | Eitan et al. |
| 5,870,335 A | 2/1999 | Khan et al. | 6,128,227 A | 10/2000 | Kim |
| 5,872,848 A | 2/1999 | Romney et al. | 6,130,452 A | 10/2000 | Lu et al. |
| 5,875,128 A | 2/1999 | Ishizuka et al. | 6,130,572 A | 10/2000 | Ghilardelli et al. |
| 5,877,537 A | 3/1999 | Aoki | 6,130,574 A | 10/2000 | Bloch et al. |
| 5,880,620 A | 3/1999 | Gitlin et al. | 6,133,095 A | 10/2000 | Eitan et al. |
| 5,886,927 A | 3/1999 | Takeuchi | 6,134,156 A | 10/2000 | Eitan |
| RE36,179 E | 4/1999 | Shimoda | 6,137,718 A | 10/2000 | Reisinger |
| 5,892,710 A | 4/1999 | Fazio et al. | 6,147,904 A | 11/2000 | Liron |
| 5,903,031 A | 5/1999 | Yamada et al. | 6,147,906 A | 11/2000 | Bill et al. |
| 5,910,924 A | 6/1999 | Tanaka et al. | 6,148,435 A | 11/2000 | Bettman |
| 5,920,503 A | 7/1999 | Lee et al. | 6,150,800 A | 11/2000 | Kinoshita et al. |
| 5,920,507 A | 7/1999 | Takeuchi et al. | 6,154,081 A | 11/2000 | Pakkala et al. |
| 5,926,409 A | 7/1999 | Engh et al. | 6,156,149 A | 12/2000 | Cheung et al. |
| 5,930,195 A | 7/1999 | Komatsu et al. | 6,157,242 A | 12/2000 | Fukui |

| | | | | | | |
|---|---|---|---|---|---|---|
| 6,157,570 | A | 12/2000 | Nachumovsky | 6,353,555 B1 | 3/2002 | Jeong |
| 6,163,048 | A | 12/2000 | Hirose et al. | 6,356,062 B1 | 3/2002 | Elmhurst et al. |
| 6,163,484 | A | 12/2000 | Uekubo | 6,356,469 B1 | 3/2002 | Roohparvar et al. |
| 6,169,691 | B1 | 1/2001 | Pasotti et al. | 6,359,501 B2 | 3/2002 | Lin et al. |
| 6,175,519 | B1 | 1/2001 | Lu et al. | 6,374,337 B1 | 4/2002 | Estakhri |
| 6,175,523 | B1 | 1/2001 | Yang et al. | 6,385,086 B1 | 5/2002 | Mihara et al. |
| 6,181,597 | B1 | 1/2001 | Nachumovsky | 6,396,741 B1 | 5/2002 | Bloom et al. |
| 6,181,605 | B1 | 1/2001 | Hollmer et al. | 6,400,209 B1 | 6/2002 | Matsuyama et al. |
| 6,185,143 | B1 | 2/2001 | Perner et al. | 6,400,607 B1 | 6/2002 | Pasotti et al. |
| 6,188,211 | B1 | 2/2001 | Rincon-Mora et al. | 6,407,537 B2 | 6/2002 | Antheunis |
| 6,190,966 | B1 | 2/2001 | Ngo et al. | 6,410,388 B1 | 6/2002 | Kluth et al. |
| 6,192,445 | B1 | 2/2001 | Rezvani | 6,417,081 B1 | 7/2002 | Thurgate |
| 6,195,196 | B1 | 2/2001 | Kimura et al. | 6,418,506 B1 | 7/2002 | Pashley et al. |
| 6,297,096 | B1 | 2/2001 | Boaz | 6,426,898 B1 | 7/2002 | Mihnea et al. |
| 6,198,342 | B1 | 3/2001 | Kawai | 6,429,063 B1 | 8/2002 | Eitan |
| 6,201,282 | B1 | 3/2001 | Eitan | 6,433,624 B1 | 8/2002 | Grossnikle et al. |
| 6,201,737 | B1 | 3/2001 | Hollmer et al. | 6,436,766 B1 | 8/2002 | Rangarajan et al. |
| 6,205,055 | B1 | 3/2001 | Parker | 6,436,768 B1 | 8/2002 | Yang et al. |
| 6,205,056 | B1 | 3/2001 | Pan et al. | 6,438,031 B1 | 8/2002 | Fastow |
| 6,205,059 | B1 | 3/2001 | Gutala et al. | 6,438,035 B2 | 8/2002 | Yamamoto et al. |
| 6,208,200 | B1 | 3/2001 | Arakawa | 6,440,797 B1 | 8/2002 | Wu et al. |
| 6,208,557 | B1 | 3/2001 | Bergemont et al. | 6,442,074 B1 | 8/2002 | Hamilton et al. |
| 6,214,666 | B1 | 4/2001 | Mehta | 6,445,030 B1 | 9/2002 | Wu et al. |
| 6,215,148 | B1 | 4/2001 | Eitan | 6,448,750 B1 | 9/2002 | Shor et al. |
| 6,215,697 | B1 | 4/2001 | Lu et al. | 6,449,188 B1 | 9/2002 | Fastow |
| 6,215,702 | B1 | 4/2001 | Derhacobian et al. | 6,449,190 B1 | 9/2002 | Bill |
| 6,218,695 | B1 | 4/2001 | Nachumovsky | 6,452,438 B1 | 9/2002 | Li |
| 6,219,277 | B1 | 4/2001 | Devin et al. | 6,455,896 B1 | 9/2002 | Chou et al. |
| 6,219,290 | B1 | 4/2001 | Chang et al. | 6,456,528 B1 | 9/2002 | Chen |
| 6,222,762 | B1 | 4/2001 | Guterman et al. | 6,456,533 B1 | 9/2002 | Hamilton et al. |
| 6,222,768 | B1 | 4/2001 | Hollmer et al. | 6,456,539 B1 | 9/2002 | Nguyen et al. |
| 6,233,180 | B1 | 5/2001 | Eitan et al. | 6,458,656 B1 | 10/2002 | Park et al. |
| 6,240,032 | B1 | 5/2001 | Fukumoto | 6,458,677 B1 | 10/2002 | Hopper et al. |
| 6,240,040 | B1 | 5/2001 | Akaogi et al. | 6,469,929 B1 | 10/2002 | Kushnarenko et al. |
| 6,246,555 | B1 | 6/2001 | Tham | 6,469,935 B2 | 10/2002 | Hayashi |
| 6,252,442 | B1 | 6/2001 | Malherbe | 6,472,706 B2 | 10/2002 | Widdershoven et al. |
| 6,252,799 | B1 | 6/2001 | Liu et al. | 6,477,084 B1 | 11/2002 | Eitan |
| 6,256,231 | B1 | 7/2001 | Lavi et al. | 6,477,085 B1 | 11/2002 | Kuo |
| 6,261,904 | B1 | 7/2001 | Pham et al. | 6,490,204 B2 | 12/2002 | Bloom et al. |
| 6,265,268 | B1 | 7/2001 | Halliyal et al. | 6,496,414 B2 | 12/2002 | Kasa et al. |
| 6,266,281 | B1 | 7/2001 | Derhacobian et al. | 6,504,756 B2 | 1/2003 | Gonzalez et al. |
| 6,272,047 | B1 | 8/2001 | Mihnea et al. | 6,510,082 B1 | 1/2003 | Le et al. |
| 6,275,414 | B1 | 8/2001 | Randolph et al. | 6,512,701 B1 | 1/2003 | Hamilton et al. |
| 6,281,545 | B1 | 8/2001 | Liang et al. | 6,519,180 B2 | 2/2003 | Tran et al. |
| 6,282,133 | B1 | 8/2001 | Nakagawa et al. | 6,519,182 B1 | 2/2003 | Derhacobian et al. |
| 6,282,145 | B1 | 8/2001 | Tran et al. | 6,522,585 B2 | 2/2003 | Pasternak |
| 6,285,246 | B1 | 9/2001 | Basu | 6,525,969 B1 | 2/2003 | Kurihara et al. |
| 6,285,574 | B1 | 9/2001 | Eitan | 6,528,390 B2 | 3/2003 | Komori et al. |
| 6,285,589 | B1 | 9/2001 | Kajitani | 6,529,412 B1 | 3/2003 | Chen et al. |
| 6,285,614 | B1 | 9/2001 | Mulatti et al. | 6,532,173 B2 | 3/2003 | Lioka et al. |
| 6,292,394 | B1 | 9/2001 | Cohen et al. | 6,535,020 B1 | 3/2003 | Yin |
| 6,297,143 | B1 | 10/2001 | Foote et al. | 6,535,434 B2 | 3/2003 | Maayan et al. |
| 6,297,974 | B1 | 10/2001 | Ganesan et al. | 6,537,881 B1 | 3/2003 | Rangarjan et al. |
| 6,304,485 | B1 | 10/2001 | Harari et al. | 6,538,270 B1 | 3/2003 | Randolph et al. |
| 6,307,784 | B1 | 10/2001 | Hamilton et al. | 6,541,816 B2 | 4/2003 | Ramsbey et al. |
| 6,307,807 | B1 | 10/2001 | Sakui et al. | 6,552,387 B1 | 4/2003 | Eitan |
| 6,320,786 | B1 | 11/2001 | Chang et al. | 6,555,436 B2 | 4/2003 | Ramsbey et al. |
| 6,324,094 | B1 | 11/2001 | Chevallier | 6,559,500 B2 | 5/2003 | Torii |
| 6,326,265 | B1 | 12/2001 | Liu et al. | 6,562,683 B1 | 5/2003 | Wang et al. |
| 6,330,192 | B1 | 12/2001 | Ohba et al. | 6,566,194 B1 | 5/2003 | Ramsbey et al. |
| 6,331,950 | B1 | 12/2001 | Kuo et al. | 6,566,699 B2 | 5/2003 | Eitan |
| 6,335,874 | B1 | 1/2002 | Eitan | 6,567,303 B1 | 5/2003 | Hamilton et al. |
| 6,335,990 | B1 | 1/2002 | Chen et al. | 6,567,312 B1 | 5/2003 | Torii et al. |
| 6,337,502 | B1 | 1/2002 | Eitan et al. | 6,567,316 B1 | 5/2003 | Ohba et al. |
| 6,339,556 | B1 | 1/2002 | Watanabe | 6,574,139 B2 | 6/2003 | Kurihara |
| 6,343,033 | B1 | 1/2002 | Parker | 6,577,514 B2 | 6/2003 | Shor et al. |
| 6,344,959 | B1 | 2/2002 | Milazzo | 6,577,532 B1 | 6/2003 | Chevallier |
| 6,346,442 | B1 | 2/2002 | Aloni et al. | 6,577,547 B2 | 6/2003 | Ukon |
| 6,348,381 | B1 | 2/2002 | Jong | 6,583,005 B2 | 6/2003 | Hashimoto et al. |
| 6,348,711 | B1 | 2/2002 | Eitan | 6,583,007 B1 | 6/2003 | Eitan |
| 6,351,415 | B1 | 2/2002 | Kushnarenko | 6,583,479 B1 | 6/2003 | Fastow et al. |
| 6,353,356 | B1 | 3/2002 | Liu | 6,584,017 B2 | 6/2003 | Maayan et al. |
| 6,353,554 | B1 | 3/2002 | Banks | 6,590,811 B1 | 7/2003 | Hamilton et al. |

| | | |
|---|---|---|
| 6,593,606 B1 | 7/2003 | Randolph et al. |
| 6,594,181 B1 | 7/2003 | Yamada |
| 6,608,526 B1 | 8/2003 | Sauer |
| 6,608,905 B1 | 8/2003 | Muza et al. |
| 6,614,052 B1 | 9/2003 | Zhang |
| 6,614,295 B2 | 9/2003 | Tsuchi |
| 6,614,686 B1 | 9/2003 | Kawamura |
| 6,614,690 B2 | 9/2003 | Roohparvar |
| 6,614,692 B2 | 9/2003 | Eliyahu et al. |
| 6,617,179 B1 | 9/2003 | Kim |
| 6,617,215 B1 | 9/2003 | Halliyal et al. |
| 6,618,290 B1 | 9/2003 | Wang et al. |
| 6,624,672 B2 | 9/2003 | Confaloneri et al. |
| 6,627,555 B2 | 9/2003 | Eitan et al. |
| 6,630,384 B1 | 10/2003 | Sun et al. |
| 6,633,496 B2 | 10/2003 | Maayan et al. |
| 6,633,499 B1 | 10/2003 | Eitan et al. |
| 6,633,956 B1 | 10/2003 | Mitani |
| 6,636,440 B2 | 10/2003 | Maayan et al. |
| 6,639,271 B1 | 10/2003 | Zheng et al. |
| 6,639,837 B2 | 10/2003 | Takano et al. |
| 6,639,844 B1 | 10/2003 | Liu et al. |
| 6,639,849 B2 | 10/2003 | Takahashi et al. |
| 6,642,148 B1 | 11/2003 | Ghandehari et al. |
| 6,642,573 B1 | 11/2003 | Halliyal et al. |
| 6,642,586 B2 | 11/2003 | Takahashi |
| 6,643,170 B2 | 11/2003 | Huang et al. |
| 6,643,177 B1 | 11/2003 | Le et al. |
| 6,643,178 B2 | 11/2003 | Kurihara |
| 6,643,181 B2 | 11/2003 | Sofer et al. |
| 6,645,801 B1 | 11/2003 | Ramsbey et al. |
| 6,649,972 B2 | 11/2003 | Eitan |
| 6,650,568 B2 | 11/2003 | Iijima |
| 6,653,190 B1 | 11/2003 | Yang et al. |
| 6,653,191 B1 | 11/2003 | Yang et al. |
| 6,653,685 B2 | 11/2003 | Katayama et al. |
| 6,654,296 B2 | 11/2003 | Jang et al. |
| 6,664,588 B2 | 12/2003 | Eitan |
| 6,665,769 B2 | 12/2003 | Cohen et al. |
| 6,670,241 B1 | 12/2003 | Kamal et al. |
| 6,670,669 B1 | 12/2003 | Kawamura |
| 6,674,138 B1 | 1/2004 | Halliyal et al. |
| 6,677,805 B2 | 1/2004 | Shor et al. |
| 6,680,509 B1 | 1/2004 | Wu et al. |
| 6,686,242 B2 | 2/2004 | Willer et al. |
| 6,690,602 B1 | 2/2004 | Le et al. |
| 6,693,483 B2 | 2/2004 | Deml et al. |
| 6,700,818 B2 | 3/2004 | Shappir et al. |
| 6,717,207 B2 | 4/2004 | Kato |
| 6,723,518 B2 | 4/2004 | Papsidero et al. |
| 6,731,542 B1 | 5/2004 | Le et al. |
| 6,738,289 B2 | 5/2004 | Gongwer et al. |
| 6,744,692 B2 | 6/2004 | Shiota et al. |
| 6,765,259 B2 | 7/2004 | Kim |
| 6,768,165 B1 | 7/2004 | Eitan |
| 6,781,876 B2 | 8/2004 | Forbes et al. |
| 6,788,579 B2 | 9/2004 | Gregori et al. |
| 6,791,396 B2 | 9/2004 | Shor et al. |
| 6,794,249 B2 | 9/2004 | Palm et al. |
| 6,794,280 B2 | 9/2004 | Chang |
| 6,798,699 B2 | 9/2004 | Mihnea et al. |
| 6,818,956 B2 | 11/2004 | Kuo et al. |
| 6,829,172 B2 | 12/2004 | Bloom et al. |
| 6,831,872 B2 | 12/2004 | Matsuoka |
| 6,836,431 B2 | 12/2004 | Chang |
| 6,839,280 B1 | 1/2005 | Chindalore et al. |
| 6,859,028 B2 | 2/2005 | Toner |
| 6,870,772 B1 | 3/2005 | Nitta et al. |
| 6,871,258 B2 | 3/2005 | Micheloni et al. |
| 6,885,585 B2 | 4/2005 | Maayan et al. |
| 6,885,590 B1 | 4/2005 | Zheng et al. |
| 6,906,357 B1 | 6/2005 | Vashchenko et al. |
| 6,912,160 B2 | 6/2005 | Yamada |
| 6,917,541 B2 | 7/2005 | Shimbayashi et al. |
| 6,917,544 B2 | 7/2005 | Maayan et al. |
| 6,928,001 B2 | 8/2005 | Avni et al. |
| 6,930,928 B2 | 8/2005 | Liu et al. |
| 6,937,521 B2 | 8/2005 | Avni |
| 6,937,523 B2 | 8/2005 | Eshel |
| 6,954,393 B2 | 10/2005 | Lusky et al. |
| 6,967,872 B2 | 11/2005 | Quader et al. |
| 6,967,896 B2 | 11/2005 | Eisen et al. |
| 6,977,410 B2 | 12/2005 | Naso et al. |
| 6,981,188 B2 | 12/2005 | Galzur et al. |
| 6,996,692 B2 | 2/2006 | Kuono |
| 7,043,672 B2 | 5/2006 | Merritt |
| 7,079,420 B2 | 7/2006 | Shappir et al. |
| 7,116,577 B2 | 10/2006 | Eitan |
| 7,125,763 B1 | 10/2006 | Sobek et al. |
| 2001/0006477 A1 | 7/2001 | Banks |
| 2002/0004878 A1 | 1/2002 | Norman |
| 2002/0004921 A1 | 1/2002 | Muranaka et al. |
| 2002/0064911 A1 | 5/2002 | Eitan |
| 2002/0101765 A1 | 8/2002 | Mihnea et al. |
| 2002/0132436 A1 | 9/2002 | Eliyahu et al. |
| 2002/0140109 A1 | 10/2002 | Keshavarzi et al. |
| 2002/0145465 A1 | 10/2002 | Shor et al. |
| 2002/0191465 A1 | 12/2002 | Maayan et al. |
| 2002/0199065 A1 | 12/2002 | Subramoney et al. |
| 2003/0001213 A1 | 1/2003 | Lai |
| 2003/0021155 A1 | 1/2003 | Yachareni et al. |
| 2003/0072192 A1 | 4/2003 | Bloom et al. |
| 2003/0076710 A1 | 4/2003 | Sofer et al. |
| 2003/0100153 A1 | 5/2003 | Kunori |
| 2003/0117841 A1 | 6/2003 | Yamashita |
| 2003/0131186 A1 | 7/2003 | Buhr |
| 2003/0134476 A1 | 7/2003 | Roizin et al. |
| 2003/0142544 A1 | 7/2003 | Maayan et al. |
| 2003/0145176 A1 | 7/2003 | Dvir et al. |
| 2003/0145188 A1 | 7/2003 | Cohen et al. |
| 2003/0155659 A1 | 8/2003 | Verma et al. |
| 2003/0190786 A1 | 10/2003 | Ramsbey et al. |
| 2003/0197221 A1 | 10/2003 | Shinozaki et al. |
| 2003/0202411 A1 | 10/2003 | Yamada |
| 2003/0206435 A1 | 11/2003 | Takahashi |
| 2003/0208663 A1 | 11/2003 | Van Buskirk et al. |
| 2003/0209767 A1 | 11/2003 | Takahashi et al. |
| 2003/0214844 A1 | 11/2003 | Iijima |
| 2003/0214852 A1 | 11/2003 | Chang |
| 2003/0218207 A1 | 11/2003 | Hashimoto et al. |
| 2003/0218913 A1 | 11/2003 | Le et al. |
| 2003/0222303 A1 | 12/2003 | Fukuda et al. |
| 2003/0227796 A1 | 12/2003 | Miki et al. |
| 2004/0007730 A1 | 1/2004 | Chou et al. |
| 2004/0012993 A1 | 1/2004 | Kurihara |
| 2004/0013000 A1 | 1/2004 | Torii |
| 2004/0014280 A1 | 1/2004 | Willer et al. |
| 2004/0014290 A1 | 1/2004 | Yang et al. |
| 2004/0017717 A1 | 1/2004 | Morishima |
| 2004/0021172 A1 | 2/2004 | Zheng et al. |
| 2004/0027858 A1 | 2/2004 | Takahashi et al. |
| 2004/0117395 A1 | 6/2004 | Gong et al. |
| 2004/0136236 A1 | 7/2004 | Cohen |
| 2004/0151034 A1 | 8/2004 | Shor et al. |
| 2004/0153621 A1 | 8/2004 | Polansky et al. |
| 2004/0157393 A1 | 8/2004 | Hwang |
| 2004/0222437 A1 | 11/2004 | Avni et al. |
| 2005/0058005 A1 | 3/2005 | Shappir et al. |
| 2005/0078026 A1 | 4/2005 | Cai |
| 2005/0078528 A1 | 4/2005 | Tsang et al. |
| 2005/0117395 A1 | 6/2005 | Maayan et al. |
| 2005/0117601 A1 | 6/2005 | Anderson et al. |
| 2005/0140405 A1 | 6/2005 | Do et al. |
| 2005/0213593 A1 | 9/2005 | Anderson et al. |
| 2005/0232024 A1 | 10/2005 | Atir et al. |
| 2006/0015691 A1 | 1/2006 | Louie et al. |

| | | | | | | |
|---|---|---|---|---|---|---|
| 2006/0084219 | A1 | 4/2006 | Lusky et al. | WO | WO 03/088259 | 2/2003 |
| 2006/0126382 | A1 | 6/2006 | Maayan et al. | WO | WO 03/032393 | 4/2003 |
| 2006/0126383 | A1 | 6/2006 | Shappir et al. | WO | WO 03/036651 | 5/2003 |
| 2006/0146614 | A1* | 7/2006 | Lue et al. ............. 365/185.28 | WO | WO 03/054964 | 7/2003 |
| 2007/0029625 | A1* | 2/2007 | Lue et al. ............. 257/411 | WO | WO 03/063167 | 7/2003 |
| 2007/0081393 | A1* | 4/2007 | Lue et al. ............. 365/185.28 | WO | WO 03/063168 | 7/2003 |
| 2007/0087482 | A1* | 4/2007 | Yeh et al. ............. 438/120 | WO | WO 03/079370 | 9/2003 |
| | | | | WO | WO 03/079446 | 9/2003 |

FOREIGN PATENT DOCUMENTS

| | | |
|---|---|---|
| EP | 0751560 | 6/1995 |
| EP | 0693781 | 1/1996 |
| EP | 0 822 557 | 2/1998 |
| EP | 0 843 398 | 5/1998 |
| EP | 0580467 | 9/1998 |
| EP | 0461764 | 7/2000 |
| EP | 1 071 096 | 1/2001 |
| EP | 1073120 | 1/2001 |
| EP | 1 091 418 | 4/2001 |
| EP | 1126468 | 8/2001 |
| EP | 0740307 | 12/2001 |
| EP | 1164597 | 12/2001 |
| EP | 1 207 552 | 5/2002 |
| EP | 1 223 586 | 7/2002 |
| EP | 1324343 | 7/2003 |
| EP | 1 365 452 | 11/2003 |
| EP | 001217744 | 3/2004 |
| GB | 1297899 | 11/1972 |
| GB | 2157489 | 3/1985 |
| JP | 54-053929 | 4/1979 |
| JP | 54125938 | 9/1979 |
| JP | 58094199 U | 6/1983 |
| JP | 60-200566 | 10/1985 |
| JP | 60201594 | 10/1985 |
| JP | 63-249375 | 10/1988 |
| JP | 3-285358 | 12/1991 |
| JP | 04-226071 | 8/1992 |
| JP | 05021758 | 1/1993 |
| JP | 05-326893 | 12/1993 |
| JP | 06151833 | 5/1994 |
| JP | 06-232416 | 8/1994 |
| JP | 07193151 | 7/1995 |
| JP | 08-106791 | 4/1996 |
| JP | 04-291962 | 10/1996 |
| JP | 08-297988 | 11/1996 |
| JP | 09-017981 | 1/1997 |
| JP | 09162314 | 6/1997 |
| JP | 10-055691 | 2/1998 |
| JP | 10-106276 | 4/1998 |
| JP | 10-199263 | 7/1998 |
| JP | 10-228784 | 8/1998 |
| JP | 10-228786 | 8/1998 |
| JP | 10 334676 | 12/1998 |
| JP | 11-162182 | 6/1999 |
| JP | 11-219593 | 8/1999 |
| JP | 11-354758 | 12/1999 |
| JP | 2000-315392 | 11/2000 |
| JP | 2001-085646 | 3/2001 |
| JP | 2001-118392 | 4/2001 |
| JP | 2001-156189 | 6/2001 |
| JP | 2002-216488 | 8/2002 |
| JP | 3358663 | 10/2002 |
| WO | WO 81/00790 | 3/1981 |
| WO | WO 96/15553 | 5/1996 |
| WO | WO 96/25741 | 8/1996 |
| WO | WO 98/03977 | 1/1998 |
| WO | WO 99/31670 | 6/1999 |
| WO | WO 99/57728 | 11/1999 |
| WO | WO 00/46808 | 8/2000 |
| WO | WO 01/65566 | 9/2001 |
| WO | WO 01/65567 | 9/2001 |
| WO | WO 01/84552 | 11/2001 |
| WO | WO 02/43073 | 5/2002 |
| WO | WO 03/083916 | 10/2003 |
| WO | WO 03/088258 | 10/2003 |
| WO | WO 03/088260 | 10/2003 |
| WO | WO 03/088261 | 10/2003 |
| WO | WO 03/088353 | 10/2003 |
| WO | WO 03/100790 | 12/2003 |

OTHER PUBLICATIONS

U.S. Appl. No. 11/489,327, filed Jul. 18, 2006, Eitan et al.
U.S. Appl. No. 11/440,624, filed May 24, 2006, Lusky et al.
U.S. Appl. No. 11/489,747, filed Jul. 18, 2006, Bloom et al.
U.S. Appl. No. 11/336,093, filed Jan. 20, 2006, Eitan et al.
U.S. Appl. No. 11/440,624, filed May 24, 2006, Lusky et al.
Bude et al., EEPROM/Flash Sub 3.0V drain—Source Bias Hot Carrier Writing, IEDM, 1995, pp. 989-992.
Bude et al., Secondary Electron Flash—a High Performance, Low Power Flash Technology for 0.35 um and below, IEDM, 1997, 279-282.
Bude et al., Modeling Nonequilibrium Hot Carrier Device Effects, Conference of Insulator Specialists of Europe, Jun. 1997, Sweden.
Jung et al., IEEE Journal of Solid-State Circuits, Nov. 1996, 1575-1583, vol. 31, No. 11.
Campardo et al., IEEE Journal of Solid-State Circuits, Nov. 2000, 1655-1667, vol. 35, No. 11.
Lin et al., Novel Source-Controlled Self-Verified Programming for Multilevel EEPROM's, IEEE Transactions on Electron Devices, Jun. 2000, 1166-1174, vol. 47, No. 6.
Chan et al., A True Single-Transistor Oxide-Nitride-Oxide EEPROM Device, IEEE Electron Device Letters, Mar. 1987, vol. EDL-8, No. 3.
Eitan et al., "Hot-Electron Injection into the Oxide in n-Channel MOS Devices", IEEE Transactions on Electron Devices, vol. ED-28, No. 3, pp. 328-370, Mar. 1981.
Roy Anirban, "Characterization and Modeling of Charge Trapping and Retention in Novel Multi-Dielectric Nonvolatile Semiconductor Memory Devices", Microelectronics Laboratory, Sherman Fairchild Center, Department of Computer Science and Electrical Engineering, Bethlehem, Pennsylvania, p. 1-35, 1989.
Tanaka et al., "A Quick Intelligent Page-Programming Architecture and a Shielded Bitline Sensing Method for 3 V-Only NAND Flash Memory", IEEE Journal of Solid-State Circuits, vol. 29, No. 11, Nov. 1994, pp. 1366-1373.
Ma et al., A Dual-bit Split-Gate EEPROM (DSG) Cell in Contactless Array for Single-Vcc High Density Flash Memories, IEEE, 1994, 57-60.
Oshima et al., Process and Device Technologies for 16Mbit EPROMs with Large-Tilt-Angle Implanted P-Pocket Cell, IEEE, Dev. 1990, Ch. 2865-4/90/0000-0095, pp. 5 2 1-5 2 4, San Francisco, California.
Lee, A new approach for the floating-gate MOS nonvolatile memory, Applied Physics Letters, Oct. 1977, 475-476, vol. 31, No. 7, American Institute of Physics.
Glasser et al., MOS Device Electronics, The Design and Analysis of VLSI Circuits, Chapter 2, 67-163, 1998, Addison-Wesley Publishing Company.
Bhattacharyya et al., FET Gate Structure for Nonvolatile N-Channel Read-Mostly Memory Device, IBM Technical Disclosure Bulletin, Nov. 1975, 1768, vol. 18, No. 6.
Ricco et al., Nonvolatile Multilevel Memories for Digital Applications, Dec. 1998, 2399-2421, vol. 86, No. 12, Institute of Electrical and Electronics Engineers, Inc.
Martin, Improved Circuits for the Realization of Switched-Capacitor Filters, IEEE Transactions on Circuits and Systems, Apr. 1980, 237-244, vol. CAS-27.
Tseng et al., "Thin CVD Stacked Gate Dielectric for ULSI Technology", IEEE, pp. 321-214; 1993, 13.1.1-13.1.4.

Pickar, Ion Implantation in Silicon—Physics, Processing, and Microelectronic Devices, Applied Solid State Science, 1975, 151-241, vol. 5, Academic Press.

2 Bit/Cell EEPROM Cell Using Band-To-Band Tunneling for Data Read-Out, IBM Technical Disclosure Bulletin, 1992, 136-140, vol. 35 No. 4B.

Umezawa, et al., A 5-V-Only Operation 0.6-μm Flash EEPROM with Row Decoder Scheme in Triple-Well Structure, IEEE Journal of Solid-State Circuits, 1992, 1540, vol. 27.

Mitchell, et al., A new self-aligned planar array cell for ultra high density EPROMS, 1987.

Esquivel, et al., High Density Contactless, Self Aligned EPROM Cell Array Technology, 1986.

Johns, Martin, Analog Integrated Circuit Design, Jun. 1, 1997, Chapter 10, John Wiley and Sons Inc.

Allen, et al., CMOS Analog Circuit Design, 2002, 259 pages, Oxford University Press.

Klinke, et al., A very-high-slew-rate CMOS operational amplifier, IEEE Journal of Solid-State Circuits, 1989, 744-746, 24 vol.

Shor, et al, paper WA2.04.01—Self regulated Four phased charge pump with boosted wells, ISCAS 2002.

Fotouhi, An efficient CMOS line driver for 1.544-Mb/s T1 and 2.048-Mb/s E1 applications, IEEE Journal of Solid-State Circuits, 2003, 226-236 pages, 38vol.

P-N Junction Diode, Physics of semiconductor devices, 1981, ch. 2, "A Wiley-Interscience Publication", John Wiley & Sons Publishers.

Chang, Non Volatile Semiconductor Memory Devices, Proceedings of the IEEE, 64 vol., No. 7 , pp. 1039-1059; Jul. 1976.

Yoon, Sukyoon, et al., A Novel Substrate Hot Electron and Hole Injection Structure with a double-implanted buried-channel MOSFET, IEEE Transactions on Electron Devices, Dec. 1991, p. 2722, vol. 38, No. 12.

4 Bits of Digital Data Fit in a Single Cell, Technology Newsletter, Electronic Design, Apr. 1, 1996.

M. Specht et al, Novel Dual Bit Tri- Gate Charge Trapping Memory Devices, IEEE Electron Device Letters, vol. 25, No. 12, Dec. 2004, pp. 810-812.

"Design Considerations in Scaled SONOS Nonvolatile Memory Devices" Bu, Jiankang et al. , Lehigh University, Bethlehem, PA, Power Point Presentation, pp. 1-24, 2000; http://klabs.org/richcontent/MemoryContent/nvmt_symp/nvmts_2000/presentations/bu_white_sonos_lehigh_univ.pdf.

"SONOS Nonvolatile Semiconductor Memories for Space and Military Applications", Adams et al., Symposium, 2000. http://klabs.org/richcontent/MemoryContent/nvmt_symp/nvmts_2000/papers/adams_d.pdf.

"Phillips Research—Technologies—Embedded Nonvolatile Memories" http://research.philips.com/technologies/ics/nvmemories/index.html.

"Semiconductor Memory: Non-Volatile Memory (NVM)", National University of Singapore, Department of Electrical and Computer Engineering: http://ece.nus.edu.sg/stfpage/elezhucx/myweb/NVM.pdf.

"Saifun Non-Volatile Memory Technology", 1st Edition, 2005, published and written by Saifun Semiconductors Ltd. 1110 pgs.

European Search Report 06100524.5, May 16, 2006.

European Search Report 06100507.0, Mar. 28, 2007.

European Search Report 04791843.8, Feb. 13, 2007.

Scalable 2-bit silicon-oxide-nitride-oxide-silicon (SONOS) memory with physically separated local nitrides under a merged gate, Lee et al., Solid State Electronics 48 (2004), pp. 1771-1775.

Mahapatra et al. , CHISEL Flash EEPROM—Part I: Performance and Scaling; IEEE Transactions on Electron Devices, vol. 49, No. 7, Jul. 2002.

Mohapatra et al., CHISEL Programming Operation of Scaled NOR Flash EEPROMs—Effect of Voltage Scaling, Device Scaling and Technological Parameters IEEE Transactions on Electron Devices, vol. 50, No. 10, Oct. 2003.

European Search Report #PCT/IL07/00032 dated Jun. 10, 2008.

\* cited by examiner

Channel Hot Electron (CHE) Injection
in a floating gate memory cell

Fowler-Nordheim Tunneling (FNT)
in a floating gate memory cell

CHE programming the right bit of an NROM

CHE programming the left bit of an NROM

HHI erasing the right bit of an NROM

HHI erasing the left bit of an NROM

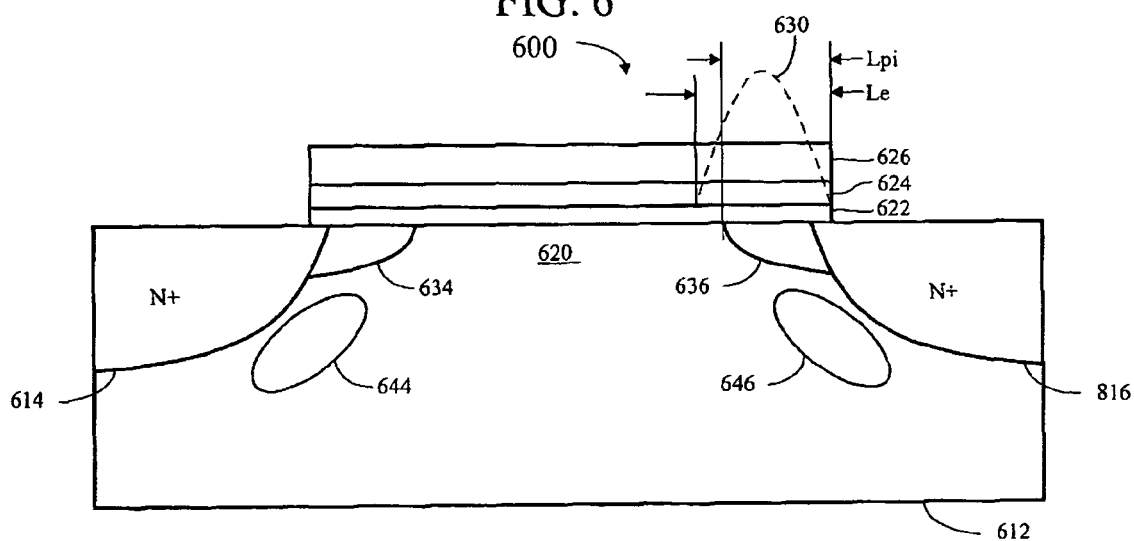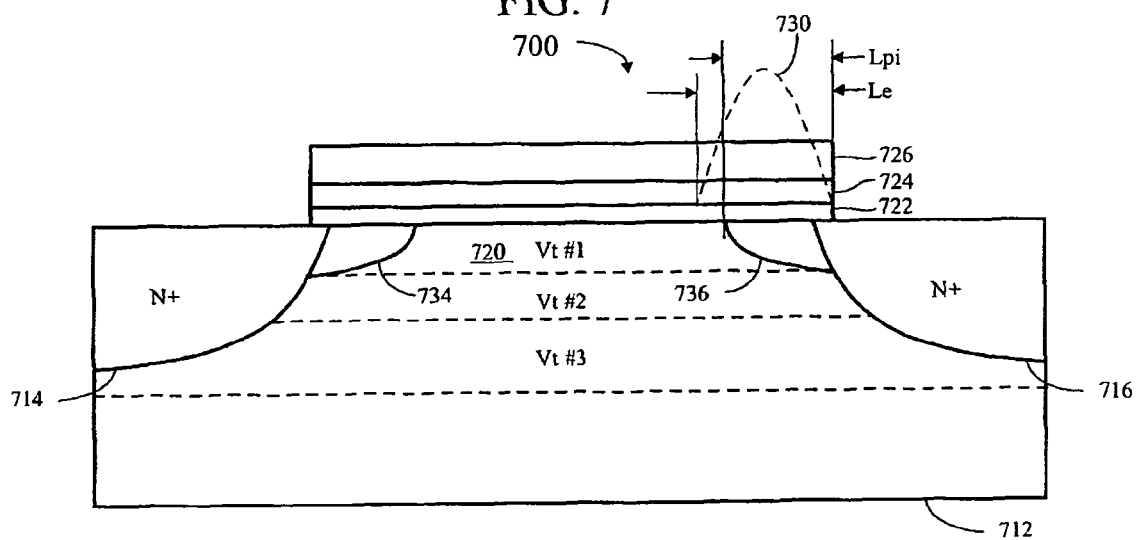

SECONDARY INJECTION FOR NROM

CROSS-REFERENCE(S) TO RELATED APPLICATION(S)

This application claims the benefit of U.S. Provisional Application No. 60/758,204, filed Jan. 12, 2006, the entire disclosure of which is incorporated herein by reference.

This application claims the benefit of U.S. Provisional Application No. 60/773,643, filed Feb. 16, 2006, the entire disclosure of which is incorporated herein by reference.

This application claims the benefit of U.S. Provisional Application No. 60/777,238, filed Feb. 28, 2006, the entire disclosure of which is incorporated herein by reference.

This application claims the benefit of U.S. Provisional Application No. 60/777,111, filed Feb. 28, 2006, the entire disclosure of which is incorporated herein by reference.

TECHNICAL FIELD

This disclosure relates to nitride read only memory (NROM) and other ONO (oxide-nitride-oxide) cells and other microelectronic devices and structures and, more particularly, to modes of injecting electrons into the charge storage areas of NROM cells.

BACKGROUND

The Field Effect Transistor

The transistor is a solid state semiconductor device which can be used for amplification, switching, voltage stabilization, signal modulation and many other functions. Generally, a transistor has three terminals, and a voltage applied to a specific one of the terminals controls current flowing between the other two terminals.

The terminals of a field effect transistor (FET) are commonly named source, gate and drain. In the FET a small amount of voltage is applied to the gate in order to control current flowing between the source and drain. In FETs the main current appears in a narrow conducting channel formed near (usually primarily under) the gate. This channel connects electrons from the source terminal to the drain terminal. The channel conductivity can be altered by varying the voltage applied to the gate terminal, enlarging or constricting the channel and thereby controlling the current flowing between the source and the drain.

FIG. 1 illustrates a FET 100 comprising a p-type substrate, and two spaced-apart n-type diffusion areas—one of which will serve as the "source", the other of which will serve as the "drain" of the transistor. The space between the two diffusion areas is the "channel". A thin dielectric layer is disposed over the substrate in the neighborhood of the channel, and a "gate" structure is disposed over the dielectric layer atop the channel. (The dielectric under the gate is also commonly referred to as "gate oxide" or "gate dielectric".) Electrical connections (not shown) may be made to the source, the drain, and the gate. The substrate may be grounded.

Generally, when there is no voltage on the gate, there is no electrical conduction (connection) between the source and the drain. As voltage (of the correct polarity) is applied to the gate, there is a "field effect" in the channel between the source and the drain, and current can flow between the source and the drain, and can be controlled by the voltage applied to the gate. In this manner, a small signal (gate voltage) can control a relatively large signal (current flow between the source and the drain).

The Floating Gate Transistor

A floating gate transistor is generally a transistor structure, broadly based on the FET, as described hereinabove. As illustrated in FIG. 2, the floating gate transistor 200 has a source and a drain, but rather than having only one gate, it has two gates which are called control gate (CG) and floating gate (FG). It is this arrangement of control gate and floating gate which enables the floating gate transistor to function as a memory cell, as described hereinbelow.

The floating gate is disposed over tunnel oxide (comparable to the gate oxide of the FET). The floating gate is a conductor, the tunnel oxide is an insulator (dielectric material). Another layer of oxide (interpoly oxide, also a dielectric material) separates the floating gate from the control gate.

Since the floating gate is a conductor, and is surrounded by dielectric material, it can store a charge. Electrons can move around freely within the conductive material of the floating gate (which comports with the basic definition of a "conductor").

Since the floating gate can store a charge, it can exert a field effect on the channel region between the source and the drain, in a manner similar to how a normal FET works, as described hereinabove. Mechanisms for storing charges on the floating gate structure, as well as removing charges from the floating gate are described hereinbelow.

Generally, if a charge is stored on the floating gate, this represents a binary "1". If no charge is stored on the floating gate, this represents a binary "0". (These designations are arbitrary, and can be reversed so that the charged state represents binary "0" and the discharged state represents binary "1".) That represents the programming "half" of how a floating gate memory cell operates. The other half is how to determine whether there is a charge stored on the floating gate—in other words, to "read" the memory cell. Generally, this is done by applying appropriate voltages to the source, drain and gate terminals, and determining how conductive the channel is. Some modes of operation for a floating gate memory cell are described hereinbelow.

Normally, the floating gate non-volatile memory (NVM) cell has only a single "charge-storing area"—namely, the conductive floating gate (FG) structure, and can therefore only store a single bit of information (binary "1" or binary "0"). More recently, using a technology referred to as "multi-level cell" (MLC), two or more bits can be stored in and read from the floating gate cell.

A Two-Bit (Dual Bit) Memory Cell

Another type of memory cell, called a "nitride, read only memory" (NROM) cell, has a charge-storage structure which is different from that of the floating gate memory cell and which permits charges to be stored in two separate charge-storage areas. Generally, the two separate charge storage areas are located within a non-conductive layer disposed between the gate and the underlying substrate, such as a layer of nitride formed in an oxide-nitride-oxide (ONO) stack underneath the gate. The non-conductive layer acts as a charge-trapping medium. Generally, electrical charges will stay where they are put in the charge-trapping medium, rather than being free to move around as in the example of the conductive floating gate of the floating gate memory cell. A first bit of binary information (binary "1" or binary "0") can be stored in a first portion (such as the left-hand side) of the charge-trapping medium, and a second bit of binary information (binary "1" or binary "0") can be stored in a second portion (such as the right-hand side) of the charge-trapping medium. An alternative viewpoint is that different charge concentrations can be considered for each bit of storage.

Using MLC technology, at least two bits can be stored in and read from each of the two portions (charge storage areas) of the charge-trapping medium (for a total of 4 bits), similarly 3 bits or more than 4 bits may be identified.

FIG. 3 illustrates a basic NROM memory cell, which may be viewed as an FET with an "ONO" structure (or layer, or stack) inserted between the gate and the substrate. (One might say that the ONO structure is "substituted" for the gate oxide of the FET.)

The ONO structure is a stack (or "sandwich") of lower oxide 322, a charge-trapping material such as nitride 324, and an upper oxide 326. The ONO structure may have an overall thickness of approximately 10-25 nm, such as 18 nm, as follows:

- the bottom oxide layer 322 may be from 3 to 6 nm, for example 4 nm thick;
- the middle nitride layer 324 may be from 3 to 8 nm, for example 4 nm thick; and
- the top oxide layer 326 may be from 5 to 15 nm, for example 10 nm thick.

The NROM memory cell has two spaced apart diffusions 314 and 316 (which can function as source and drain, as discussed hereinbelow), and a channel region 320 defined in the substrate between the two diffusion regions 314 and 316.

In FIG. 3, the diffusions are labeled "N+". This means that they are regions in the substrate that have been doped with an electron donor material, such as phosphorous or arsenic. These diffusions are typically created in a larger region which is p-type cell well (CW) is doped with boron (or indium). This is the normal "polarity" for a NVM cell employing electron injection (which may also employ hole injection, such as for erase). With opposite polarity (phosphorus or arsenic implants in a n-type cell well), the primary injection mechanism would be for holes, which is generally accepted to be not as effective as electron injection. One skilled in the art will recognize that the concepts disclosed herein can be applied to opposite polarity devices.

The charge-trapping material 324 is non-conductive, and therefore, although electrical charges can be stored in the charge-trapping material, they are not free to move around, they will generally stay where they are stored. Nitride is a suitable charge-trapping material. Charge trapping materials other than nitride may also be suitable for use as the charge-trapping medium. One such material is silicon dioxide with buried polysilicon islands. A layer (324) of silicon dioxide with polysilicon islands would be sandwiched between the two layers of oxide (322) and (326). Alternatively, the charge-trapping layer 324 may be constructed by implanting an impurity, such as arsenic, into a layer of silicon dioxide deposited on top of the bottom oxide 322.

The memory cell 300 is generally capable of storing at least two bits of data—at least one right bit(s) in a first storage area of the nitride layer 324 represented by the dashed circle 323, and at least one left bit(s) in a second storage area of the nitride layer 324 represented by the dashed circle 321. Thus, the NROM memory cell can be considered to comprise two "half cells", each half cell capable of storing at least one bit(s). The storage areas 321, 323 may variously be referred to as "charge storage areas", "charge trapping areas", and the like, throughout this document. It should be understood that a half cell is not a physically separate structure from another half cell in the same memory cell. The term "half cell", as it may be used herein, is used herein only to refer to the "left" or "right" bit storage area of the ONO stack (nitride layer).

Each of the storage areas 321, 323 in the charge-trapping material 324 can exert a field effect on the channel region 320 between the source and the drain, in a manner similar to how a normal FET works, as described hereinabove (FIG. 2). Some mechanisms for injecting charges (either electrons or holes) in the storage areas of the charge-trapping material, as well as removing charges from the storage areas of the charge-trapping material are described hereinbelow. The charge storage area 321 is generally above the diffusion 314, and the charge storage area 323 is generally above the diffusion 316.

Generally, if a charge is stored in a given storage area of the charge-trapping material, this represents a binary "1", and if no charge is stored in a given storage area of the charge-trapping material, this represents a binary "0". (Again, these designations are arbitrary, and can be reversed to that the charged state represents binary "0" and the discharged state represents binary "1".) That represents the programming "half" of how an NROM memory cell operates The other half is how to determine whether there is a charge stored in a given storage area of the charge-trapping material—in other words, to "read" the memory cell. Generally, this is done by applying appropriate voltages to the diffusion regions (functioning as source and drain) and gate terminals, and determining how conductive the channel is. Some modes of operation for an NROM memory cell are described hereinbelow.

Generally, one feature of NROM cells is that rather than performing "symmetrical" programming and reading, NROM cells are beneficially programmed and read "asymmetrically", which means that programming and reading occur in opposite directions. The arrows labeled in FIG. 3 are arranged to illustrate this point. Programming may be performed in what is termed the "forward" direction and reading may be performed in what is termed the "opposite" or "reverse" direction. Some programming and reading modes of operation for memory cells are described hereinbelow.

Programming, Erasing, and Reading the Floating Gate Memory Cell

FIG. 2A illustrates a technique for programming a floating gate memory cell, using channel hot electron (CHE) injection to put charges (inject electrons) into the floating gate. The floating gate memory cell generally comprises a channel region between a source region and a drain region, and a floating gate disposed between the channel region and the control gate (compare FIG. 2). This figure illustrates various voltages which may be applied to the source (Vs), to the gate (Vg) and to the drain (Vd), from external sources and/or connections (not shown). Generally, there is no "connection" to the floating gate.

Generally, in order implement CHE injection of electrons into the floating gate, the source is grounded, the drain is set to zero or to a positive voltage (which will "attract" electrons from the source, laterally across the channel region), and the gate is also set to a positive voltage (which will "attract" electrons vertically through the tunnel oxide, into the floating gate). As electrons flow through the channel from source to drain, some of the electrons will make their way through the tunnel oxide and become stored on the floating gate. This injection of electrons into the floating gate increases the threshold voltage of the memory cell. The shift (increase) in threshold voltage can be on the order of 3 or more volts. The threshold voltage (Vt) of the memory cell can later be measured, or "read".

FIG. 2B illustrates a technique for erasing a floating gate memory cell, using a mechanism which is called "Fowler-Nordheim Tunneling", abbreviated as "F-N tunneling", or "FN tunneling", or simply "FNT".

Generally, whereas CHE injection was used (described hereinabove), in programming, to inject electrons into the floating gate, F-N tunneling (FNT) is used, in the erase operation, to remove electrons from the floating gate.

Generally, in order implement F-N tunneling of removing electrons from the floating gate, both the source and the drain are set to a positive voltage (to "attract" electrons through the tunnel oxide from the floating gate into the substrate), and the gate is set to a negative voltage (to "repel" electrons through the tunnel oxide from the floating gate into the substrate). This removal of electrons from the floating gate decreases the "threshold voltage" of the memory cell.

Generally, during programming, the threshold voltages of individual memory cells or (in the case of NROM, the two charge-storage areas of a single memory cell) are individually manipulated to represent the data desired to be stored. In contrast thereto, generally, during erase, it is normally acceptable to simply decrease the threshold voltages of a great many memory cells, all at once, such as all of the memory cells in a sector or block of a memory array.

Typically, to inhibit erase of selected memory cells, an "inhibit" signal, such as a positive voltage (which will not "repel" the electrons) may be applied to the gates of the selected memory cells. In a common array architecture, the gates of several memory cells are typically all connected to a common word line (of many such word lines) in the array. Array architecture is discussed in greater detail hereinbelow.

Regarding "reading" the contents of a memory cell, no "injection mechanism" is used. The conventional technique of reading conductive floating gate memory cells is to apply appropriate "read voltages" to the gate and drain and to ground the source. This is similar to the method of programming with the difference being that lower level voltages are applied during reading than during programming.

Since the floating gate is conductive, the trapped charge is distributed evenly throughout the entire floating conductor. In a programmed device, the threshold is therefore high for the entire channel and the process of reading becomes symmetrical. It makes no difference whether voltage is applied to the drain and the source is grounded or vice versa.

The following table presents exemplary conditions for programming, erasing and reading a floating gate memory cell.

TABLE 1

Exemplary Floating Gate Operating Conditions

|  | Vs | Vg | Vd | Vb | time |
|---|---|---|---|---|---|
| Erase (FN) | >=0 V | −8-10 V | >=0 V | 6-8 V | 100 ms |
| Program (CHE) | gnd | 8-10 V | 4-5 V | 0 V | 1 μs |
| Read | 0 V | 5 V | 1 V | | |

Programming, Erasing and Reading the NROM Cell

NROM cells may be programmed in a manner similar to that of the floating gate memory cell, by injection of channel hot electrons into the charge storage areas (321, 323) of the ONO stack.

FIGS. 3A and 3B illustrate a technique for programming an NROM memory cell, using channel hot electron (CHE) injection to inject electrons into the charge storage areas 321 and 323. As shown in FIG. 3A, the NROM memory cell comprises a channel region between two spaced-apart diffusion regions (left and right), and an ONO stack (322, 324, 326) between the channel region and the gate (328). (Compare FIG. 3.)

Generally, NROM memory cells may be programmed similarly to floating gate memory cells, using a channel hot electron (CHE) injection mechanism. Voltages are applied to the gate and drain creating vertical and lateral electrical fields which accelerate electrons from the source along the length of the channel. As the electrons move along the channel some of them gain sufficient energy to jump over the potential barrier of the bottom silicon dioxide layer 322 (of the ONO layer) and become trapped in the silicon nitride (charge trapping) layer 324 (of the ONO layer).

The NROM cell can store charges in two separate portions 321 and 323 of the charge-trapping layer 324. For purposes of this portion of the discussion, the left region 321 stores a left bit, and the right region 323 stores a right bit. Depending on which bit (storage region) is desired to be programmed, the left and right diffusion regions 314 and 316 can act as source and drain, or as drain and source. The gate always functions as the gate.

FIG. 3A illustrates CHE programming of the right bit storage area 323. In this example, electron trapping occurs in a region near the diffusion region 316 acting as a drain, as indicated by the dashed circle 323. Electrons are trapped in the portion 323 of nitride layer 324 near but above and self-aligned with the drain region 316 because the electric fields are the strongest there. Thus, the electrons have a maximum probability of being sufficiently energized to jump the potential barrier of the oxide layer 322 and become trapped in the nitride layer 324 near the drain 316.

FIG. 3B illustrates CHE programming of the left bit. For the left bit, the situation is reversed from programming of the right bit. In simple terms, the left diffusion area 314 functions as the drain and the right diffusion area 316 functions as the source, and electrons are sufficiently energized to jump the potential barrier of the oxide layer 322 and become trapped in the nitride layer 324 near the drain 314.

In this disclosure, programming is defined as inserting electrons into the charge trapping areas of an NROM cell to represent data. Generally, more electrons in the charge trapping area creates a higher threshold voltage (Vt). A Vt higher than a threshold level may be considered to represent a binary "0", and a Vt lower than the threshold level may be considered to represent a binary "1". Generally, two threshold levels are used for SLC operation. Additional thresholds are used for MLC operation. The threshold Vt should not be confused with the initial Vt of the cell that will be typically lower than the threshold that determines the transition level from a "0" to a "1".

Generally, to erase a charge-storage area—lowering its Vt—electrons must be removed, or cancelled out, and various mechanisms are known to effect these measures.

For example, in a floating gate memory cell, Fowler-Nordheim tunneling (FNT) is commonly used to extract electrons from the floating gate, thereby lowering the Vt of the memory cell. See FIG. 2B.

For example, in a NROM memory cell, hot hole injection (HHI) is commonly used to cancel electrons in the charge-storage areas. See FIGS. 3C and 3D.

Generally, NROM memory cells may be erased using a technique called hot hole injection (HHI), or tunnel enhanced hot hole (TEHH) injection. For example, to erase an NROM memory cell, the source voltage can be set to a positive voltage such as +5 v, the gate voltage can be set to a negative voltage such as −7 v, and the drain voltage may be set to a positive voltage such as +2 volts (less than the source voltage) or may be left floating or disconnected.

Using HHI, holes (the "counterpart" of electrons) can be selectively inserted into the left portion 321 of the nitride layer 324 and into the right portion 323 of the nitride layer 324, in a controlled manner. Generally, holes which are injected cancel out electrons which are trapped (stored) in the left and right portions of nitride layer on a one-to-one basis (one hole "cancels out" one electron).

FIG. 3C illustrates erasing the right bit storage area. In this example, hole injection (HHI) occurs in a region near the diffusion region 316 acting as a drain, as indicated by the dashed circle 323. Holes are injected in the portion 323 of nitride layer 324 near but above and self-aligned with the drain region 316 because the electric fields are the strongest there. Thus, the holes have a maximum probability of being sufficiently energized to jump the potential barrier of the oxide layer 322 and become injected into the nitride layer 324 near the drain 316.

FIG. 3D illustrates HHI erasing of the left bit storage area. For the left bit storage area, the situation is reversed from erasing of the right bit storage area. In simple terms, the left diffusion area 314 functions as the drain and the right diffusion area 316 functions as the source, and holes are sufficiently energized to jump the potential barrier of the oxide layer 322 and become injected into in the nitride layer 324 near the drain 314.

"Reading" an NROM Cell

Reading an NROM memory cell may involve applying voltages to the terminals of the memory cell comparable to those used to read a floating gate memory cell, but reading may be performed in a direction opposite to that of programming. Generally, rather than performing "symmetrical" programming and reading (as is the case with the floating gate memory cell, described hereinabove), the NROM memory cell is usually programmed and read "asymmetrically", meaning that programming and reading occur in opposite directions. This is illustrated by the arrows in FIG. 3. Programming is performed in what is termed the forward direction and reading is performed in what is termed the opposite or reverse direction. For example, generally, to program the right storage area 323, electrons flow from left (source) to right (drain). To read the right storage area 323 (in other words, to read the right "bit"), voltages are applied to cause electrons to flow from right to left, in the opposite or reverse direction. For example, generally, to program the left storage area 321, electrons flow from right (source) to left (drain). To read the left storage area 321 (in other words, to read the left "bit"), voltages are applied to cause electrons to flow from left to right, in the opposite or reverse direction. See, for example, commonly-owned U.S. Pat. No. 6,768,165.

Modes of Operation for an NROM Cell

The following table presents exemplary conditions for programming, erasing and reading an NROM memory cell.

TABLE 2

Exemplary NROM Operating Conditions

|  | Vs | Vg | Vd | Vb | time |
|---|---|---|---|---|---|
| Program (CHE) | +0.5 V | 8-10 V | +4-5 V | 0 V | 0.1-1 µs |
| Erase (HHI) | 2 V | −7 V | 5 V | 0 V | 100 us |
| Read | 1.3 V | 5 V | 0 V | 0 V | 10-100 ns |

"Vs" refers to the left diffusion area, and "Vd" refers to the right diffusion area, for the operations of programming, erasing and reading the right side bit of an NROM memory cell. The operations of program and erase are typically performed using pulses, each pulse partially moving (nudging) the memory cell towards the desired Vt, followed by verify (a quick read, to see if the desired Vt has been reached), until the desired Vt has been attained. Typically, conditions are established so that only a few (for example, 3-5) pulses are required to program or erase each cell.

Exemplary operating modes for memory cells, using the mechanism of CHE injection for programming a memory cell, and the mechanisms of FNT and HHI for erasing a memory cell have been described, hereinabove. Other and additional mechanisms are known for performing the modes of operation.

Memory Array Architecture, Generally

Memory arrays are well known, and comprise a plurality (many, including many millions) of memory cells organized (including physically arranged) in rows (usually represented in drawings as going across the page, horizontally, from left-to-right) and columns (usually represented in drawings as going up and down the page, from top-to-bottom).

As discussed hereinabove, each memory cell comprises a first diffusion (functioning as source or drain), a second diffusion (functioning as drain or source) and a gate, each of which has to receive voltage in order for the cell to be operated, as discussed hereinabove. Generally, the first diffusions (usually designated "source") of a plurality of memory cells are connected to a first bit line which may be designated "BL(n)", and second diffusions (usually designated "drain") of the plurality of memory cells are connected to a second bit line which may be designated "BL(n+1)". Typically, the gates of a plurality of memory cells are connected to common word lines (WL).

FIG. 4 illustrates an array of NROM memory cells (labeled "a" through "i") connected to a number of word lines (WL) and bit lines (BL). For example, the memory cell "e" has its gate connected to WL(n), its source (left hand diffusion) is connected to BL(n), and its drain (right hand diffusion) is connected to BL(n+1). The nine memory cells illustrated in FIG. 4 are exemplary of many millions of memory cells that may be resident on a single chip.

Notice, for example that the gates of the memory cells "e" and "f" (to the right of "e") are both connected to the same word line WL(n). (The gate of the memory cell "d" to the left of "e" is also connected to the same word line WL(n).) Notice also that the right hand terminal (diffusion) of memory cell "e" is connected to the same bit line BL(n+1) as the left-hand terminal (diffusion) of the neighboring memory cell "f". In this example, the memory cells "e" and "f" have two of their three terminals connected together.

The situation of neighboring memory cells sharing the same connection—the gates of neighboring memory cells being connected to the same word line, the source (for example, right hand diffusion) of one cell being connected to the drain (for example left hand diffusion) of the neighboring cell—is even more dramatically evident in what is called "virtual ground architecture" wherein two neighboring cells actually share the same diffusion. In virtual ground array architectures, the drain of one memory cell may actually be the same diffusion which is acting as the source for its neighboring cell. Examples of virtual ground array architecture may be found in U.S. Pat. Nos. 5,650,959; 6,130,452; and 6,175,519, incorporated in their entirety by reference herein.

Secondary Electron Injection (SEI)

FIG. 5 (compare FIG. 2) illustrates a typical prior art floating gate memory cell 500 (compare 200). The floating gate memory cell comprises source and drain diffusions 514 and 516, embedded in a substrate 502. Between the source and drain diffusions is a channel region 520. A floating gate "FG" is located above the channel 520, insulated therefrom by tunnel oxide. A control gate "CG" is located above the floating gate, insulated therefrom by interpoly oxide.

Voltage levels on the source (Vs), gate (Vg), drain (Vd) and substrate (Vb) are indicated in the figure.

For most floating gate cells, the standard electron injection mechanism for programming is channel hot election (CHE) injection (sometimes abbreviated as CHEI), in which the source to drain potential drop creates a lateral field that accelerates a channel electron e1 from the source S to the drain D, as indicated by the arrow A. Near the drain 516, the high energy electrons e1 may be injected into the floating gate FG, provided that the gate voltage (Vg) creates a sufficiently great vertical field. Typical conditions for CHE injection of electrons into the floating gate of a floating gate memory cell have been discussed, above. (See Table 1. Exemplary Floating Gate Operating Conditions)

Another injection mechanism can occur, known as secondary electron injection (SEI), or simply "secondary injection". Some of the channel electrons (e1), as they accelerate from source to drain, impact valence electrons in the channel, ionizing the valence electrons, and resulting in the generation (creation) of electron/hole pairs. This is illustrated by the arrow B extending into the drain region 516, and the creation of an electron e2 and a hole h2. The probability of this occurring ionization is denoted M1 and it indicates the ratio between the channel current and the hole substrate current. The circle around M1 is representative of ionization occurring and, although (for illustrative clarity) M1 is shown in the drain 516, it should be understood that this impact ionization (of e1, resulting in e2/h2) occurs in the channel 520, next to the drain 516 or inside the drain 516 close to the channel.

Due to the positive potential (Vd) of the drain 516, generated electrons e2 may be collected by the drain 516, as indicated by arrow C. However, as indicated by the arrow D, generated holes h2 may accelerate towards the low substrate potential Vb of the substrate 502, back under the channel region 520.

In the substrate 502, another impact ionization may occur, this time between holes h2 and valence electrons, creating another electron/hole pair e3, h3 with probability M2. (The circle around M2 is representative of ionization occurring.) Holes h3 are pulled (arrow E) further into substrate 502, and are of no further concern. However, electrons e3, called secondary electrons, may be accelerated (arrow F) towards the positive gate potential Vg of the control gate and, if they have gained sufficient energy, they can be injected into the floating gate—the probability of this occurring being denoted as T. (Electrons e2 are also considered to be impact ionization electrons, but are not of interest since they have low energy and are not candidates for injection.)

Typical conditions for injection of secondary electrons e3 into the floating gate of a floating gate memory cell are shown in the following table.

TABLE 3

Exemplary Floating Gate Secondary Injection Conditions

| | Vs | Vg | Vd | Vb | time |
|---|---|---|---|---|---|
| Secondary Injection | 0 V | 5 V | 4 V | −2 V | 10 μs |

The current (Is) for secondary injection is defined as:

$$I_S = I_{ds} \times M_1 \times M_2 \times T$$

wherein $I_{ds}$ is the channel current from source to drain.

Enhancing Secondary Injection in Floating Gate Cells

Because this current is significant, some floating gate devices have been built to enhance it, thereby reducing programming time and programming voltages. The following articles discuss some possible methods to enhance the secondary injection:

J. D. Bude, et al., "Secondary Electron Flash—a High Performance, Low Power Flash Technology for 0.35.mu.m and Below", IEDM 97, pp. 279-282;

J. D. Bude, et al., "EEPROM/Flash Sub 3.0V Drain-Source Bias Hot Carrier Writing", IEDM 95, pp. 989-992; and J. D. Bude and M. R. Pinto, "Modeling Nonequilibrium Hot Carrier Device Effects", Conference of Insulator Specialists of Europe, Sweden, June 1997.

The J. D. Bude references disclose enhancing the secondary generation and injection in two ways: (i) by means of pocket implants of boron (an electron acceptor dopant) in the substrate, and (ii) by applying a negative substrate bias Vb to the substrate. (See, for example, FIGS. 2A and 2B of U.S. Pat. No. 6,429,063.

Boron pockets, when implanted with relatively high energy, enhance the field in the substrate and enhance the creation of the electron-hole pairs e3/h3, and thus increase the probability M2 of secondary electron (e3) generation. This higher boron concentration is effective also in accelerating secondary electrons and hence, enhances their probability T of injection.

The potential drop Vdb from drain to substrate is typically larger by 1 V than the potential drop Vds from drain to source due the built-in potential (Vbi) in the n+/p− substrate junction. This enhances both the probability M2 of a secondary impact and the probability T of injection. To further enhance secondary injection, a negative substrate bias Vb can be applied to the substrate.

The energy balance for secondary injection is a function of the drain voltage Vd (which defines the voltage in the channel), the built-in potential Vbi, the substrate voltage Vsub and the energy $De_{sec}$ after impact ionization. This compares to the primary electron injection mechanism (of channel hot electron injection) which is a function of the drain to source voltage Vds.

Typically, if the drain to source voltage Vds is 3 V and the substrate voltage is at 0 V (and the potential drop from drain to substrate is 1 V), the primary electrons (e1) are accelerated by 3 V while the secondary electrons are accelerated by 4 V. If the substrate voltage is decreased to −1 V, then the secondary electrons are accelerated by 5 V. Thus, applying negative voltage to the substrate increases the secondary injection mechanism.

This energy, when combined with the acceleration of secondary electron e3 over several volts of substrate to channel potential towards gate 112, makes the probability of injection T of secondary electron e3 higher than that of primary electron e1. However, there are many more primary electrons e1 available than secondary electrons e3 and thus, most of the injection remains the primary electrons e1. Since the injected electrons (primary and secondary) spread out in floating gate, there is no way to tell where injection occurred.

When the source/substrate voltage Vbs is decreased to −1.0V the potential energy into substrate increases, although the potential energy in the drain and across the channel does not change. The increased substrate potential provides additional energy to secondary electrons e3 while only slightly affecting the energy of channel electrons e1 through field distribution small changes.

Secondary injection adds to the primary injection mechanism to provide a faster and/or lower voltage injection into a floating gate cell. However, it has heretofore been believed that secondary injection is not good for all types of cells, and that there are some cells, such as nitride, programmable read only memory (NROM) cells, for which enhancing secondary injection appeared to degrade the reliability of the cell. See, for example, U.S. Pat. Nos. 6,429,063 and 6,583,007 for a more detailed discussion of secondary injection in NROM cells.

Reference is made to the following articles, each of which is incorporated by reference in its entirety herein:

Secondary Electron Flash—a High Performance Low Power Flash Technology for 0.35 um and Below, Bude, Mastraopasqua, Pinto, Gregor, Kelley, Kohler, Leung, Ma, McPartland, Roy, Singh, IEEE, 0-7803-4100-7/97, 1997. This article discusses secondary electron injection in a floating gate cell having 7.5 nm tunnel oxide, and suggests that peak CHISEL programming current may be more than 10 times smaller than typical CHE currents (in stacked gate cells).

CHISEL Flash EEPROM—Part I: Performance and Scaling, Mahapatra, Shukuri, Bude, IEEE Transactions on Electron Devices, Vol. 49. No. 7, July 2002. This article discusses secondary electron injection in a floating gate cell, and suggests that under favourable conditions, CHISEL can completely overcome CHE injection in terms of density of electrons injected into the gate electrode.

CHISEL Programming Operation of Scaled NOR Flash EEPROMs—Effect of Voltage Scaling, Device Scaling and Technological Parameters, Mohapatra, Nair, Mahapatra, Rao, Shukuri, Bude, IEEE Transactions on Electron Devices, Vol. 50. No. 10, October 2003. This article discusses secondary electron injection in a floating gate cell, and suggests that CHISEL may provide a higher programming efficiency when compared against conventional CHE operation.

Although these articles suggest that CHISEL (secondary electron injection) can be a valuable mechanism for injecting electrons, better than CHE, they fail to take into account factors relevant to memory cells such as NROM memory cells, having two separate charge storage areas in a single charge storage medium, as the articles are directed to floating gate memory cells where the charge storage medium is a conductor, electrons are free to move around, and it generally does not matter where (within the charge storage medium) the electrons are injected. In contrast thereto, the issue of where (within the charge storage medium) the electrons are injected is of paramount concern in NROM memory cells.

Consider, for example, an extreme case where when trying to program (by injecting electrons into) the right charge storage area (323), electrons were also to be injected into the left charge storage area (321). (This would be a major "2nd bit" event.) In less extreme cases, as will be discussed hereinbelow, electrons which are injected far from the junction (but not so far as to be in the other charge storage area) still present serious problems, for example with read sensitivity, and retention (inability to erase electrons far from the junction).

Managing (Reducing) Secondary Injection in NROM Cells

The phenomenon of the generation of secondary electrons and their injection into the charge storage areas (see 321, 323, FIG. 3) of NROM memory cells has been recognized. The following commonly-owned patents are specifically referenced:

U.S. Pat. No. 6,429,063 (filed Mar. 6, 2000), entitled NROM Cell With Generally Decoupled Primary and Secondary Injection (hereinafter referred to as the '063 patent), and U.S. Pat. No. 6,583,007 (filed Dec. 20, 2001), entitled Reducing Secondary Injection Effects (hereinafter referred to as the '007 patent).

At the time when these two patents were filed, it was believed that secondary injection was detrimental to the operation of NROM cells.

The '007 patent discloses methods and apparatus for managing and reducing effects of secondary injection in non-volatile memory (NVM) devices that have a non-conducting charge trapping layer, such as NROM devices, and also discloses methods and apparatus for preventing punch-through voltages from detrimentally affecting erase operations in the NVM device that has a non-conducting charge trapping layer.

As disclosed in the '007 patent, generally, movement of secondary electrons from substrate towards the ONO layer (which is also towards the gate) may be managed and may be reduced by controlling a concentration of an electron acceptor dopant in substrate. For example, reducing the presence of the electron acceptor dopant (such as boron) generally near an upper surface of substrate (that is, near the interface between the substrate and the bottom oxide layer of the ONO stack) may significantly reduce secondary electron injection in the direction towards the ONO stack and the polysilicon gate.

As disclosed in the '007 patent, the surface concentration of the electron acceptor dopant may be reduced and the concentration increased far from the upper surface of substrate by one or several methods. For example, the substrate may be constructed with a double or triple implant process. The electron acceptor dopant may be concentrated as a function of depth in the substrate. The electron acceptor dopant may be doped by means of a deep or medium-depth pocket implant (see FIG. 2 of the '007 patent). The surface concentration of the electron acceptor dopant may be reduced by doping the surface with an electron donor dopant (indicated generally in FIG. 2 of the '007 patent), such as, but not limited to, phosphor or arsenic. Although the presence of the electron acceptor dopant deep in the substrate may not reduce the probability M2 of creating electron-hole pairs e3-h3 (see FIG. 1 of the '007 patent, or FIG. 5, herein), nevertheless the distance of the dopant from the upper surface of substrate and far from the n+ junctions and will reduce the probability T of secondary injection, and reduce punch-through.

FIG. 3 of the '007 patent illustrates one example of a concentration of the electron acceptor dopant, such as boron, in terms of depth in the substrate of the NVM device. The boron is concentrated at least $1\times10^{17}$ cm$^{-2}$ at a depth of 0.1 μm from the upper surface of the substrate and deeper (for example, but not necessarily, to a depth of about 0.8 μm). At a depth of less than 0.1 μm, the boron concentration is less than $1\times10^{17}$ cm$^{-2}$.

As disclosed in the '007 patent, the concentration of the electron acceptor dopant deep in the substrate may reduce punch-through (which is generally undesirable in erase operations on the memory device) deep in the substrate. Surface punch-thorough may be reduced in erase operations by using relatively high negative gate voltages (such as in the range of −5 to −7 V) and relatively low bit line (e.g., drain) voltages to erase the memory device.

The '063 patent discloses techniques for decoupling injection of channel hot electrons into a charge trapping layer of an NROM cell from injection of non-channel (secondary) electrons into the charge trapping layer, as well as for minimizing the generation of the non-channel (secondary) electrons.

The '063 patent discloses that secondary injection reduces the performance of NROM cells because secondary electrons are injected far from the bit line junctions. These secondary electrons are not removable during erasure and thus, reduce the ability of the NROM cell to separate between the two charge storage areas.

Therefore, the '063 patent discloses decoupling the primary (CHE) injection mechanism from other injection mechanisms, such as secondary injection, and enhancing the primary mechanism while reducing the other injection mechanisms. In the '063 patent, secondary electrons (e3) are referred to as "non-channel electrons".

The '063 patent discloses a method of creating a nitride, programmable read only memory (NROM) cell including the step of decoupling injection of channel hot electrons into a charge trapping layer of the NROM cell from injection of non-channel electrons into the charge trapping layer.

In the '063 patent, the step of decoupling can include the step of minimizing the injection of the non-channel electrons into the charge trapping layer. Alternatively, it includes the step of minimizing the generation of the non-channel electrons.

The step of injection minimization includes at least one of the following steps: minimizing the concentration of Boron deep in the substrate, implanting a shallow threshold voltage implant, implanting deep bit lines and making the channel to be shorter than a standard length.

The NROM cell has at least one Boron pocket implants and the step of Boron concentration reduction includes the step of implanting Arsenic or Phosphorous pocket implants deeper than the Boron pocket implants.

A threshold voltage implant step includes the step of implanting two threshold voltage implants, a first surface implant of Boron and a second deeper implant of Arsenic or Phosphorous. Additionally, Boron pockets can be implanted.

The step of generation minimization includes at least one of the following steps:
  minimizing the concentration of Boron deep in the substrate,
  implanting a shallow threshold voltage implant, and
  making the channel to be shorter than a standard length.

The NROM cell can include a shallow threshold voltage implant at least of Boron into the channel. The concentration of the Boron is reduced by a factor of 2 at least a distance of 10-20, 20-30, 30-40 and 50-100 nm from a surface of the channel.

The '063 patent goes into great detail to explain how secondary electrons that are injected far from the bit line junctions can cause early failure of the NROM cells, because these secondary electrons are not removable during erasure and thus, they reduce the ability of the NROM cell to withstand a large number of program and erase cycles.

The '063 patent recognizes that the secondary electrons are mainly produced deep in substrate while primary electrons are produced near the surface of substrate, and attempts to decouple the two processes by affecting either the generation of the secondary electrons or by affecting the injection efficiency T, or by enhancing the primary injection while not enhancing the secondary injection to improve the ratio of the primary to secondary injections.

One solution set forth in the '063 patent (see, for example, FIG. 6A therein) is to control the boron concentration into substrate. Generally, the boron concentration is significantly reduced at about 0.5 µm from the surface of the substrate, so that fewer secondary electrons will be generated because there is little or no boron in the areas where secondary electron generation occurs.

In the '063 patent, arsenic or phosphorous (both of which are n+, "electron donors") is diffused deep into the substrate to counteract the secondary electron generating effects of boron (which is p−, "electron acceptor"). Arsenic or phosphorous, being n+, cancel the effect of the Boron (which is p−) deep in the substrate. To aid the primary injection, the boron remains present near the surface, but little boron, if any, is present deep in the substrate where secondary electrons are produced.

The '063 patent discloses (see, for example, FIGS. 10A, 10B and 10C) enhancing the surface of the channel to improve the primary (CHE) injection mechanism without improving the secondary injection mechanism. The surface enhancement may be provided by a shallow threshold voltage Vt implant of boron. The cell can be produced without a pocket implant, or with a pocket implant. A double threshold voltage implant is shown.

The '063 patent discloses a threshold voltage Vt implant which is produced after the low voltage gate oxide growth step. The Vt implant comprises boron at $3\text{-}5 \times 10^{12}/cm^2$ at 25 KeV and at an angle of 7 degrees. The threshold voltage Vt implant is a shallow implant since it occurs at the end of the high temperature processes and thus, does not have much chance to diffuse into channel. The result is an implant that is more concentrated near a surface of channel, and less concentrated further into the substrate.

The '063 patent discloses having two threshold voltage Vt implants. The first implant is a shallow implant of boron (electron acceptor). The second implant is a deep implant of arsenic or phosphorous (election donor). This "counterdoping" ensures that the boron implant extends only to a known depth. Techniques for performing these shallow and deep implants are discussed.

The '063 patent discloses adding boron pockets to the boron shallow implant. The shallow implant provides the desired surface concentration. The boron pockets add to the surface concentration and provide boron somewhat deeper into substrate. Since the shallow implant provides the desired surface concentration, the boron concentration can be reduced, to at least half that of the previous pockets. Thus, the deep concentration of boron is minimal. Techniques for performing the shallow implant and the pocket implant are discussed.

The '063 patent also discloses having a deeper junction and/or a shorter channel length $L_{eff}$. Deeper junctions will collect most of the secondary electrons before they get to the surface, thus fewer secondary electrons will be injected into the charge trapping (nitride) layer. A shorter channel has a larger lateral field, for the same drain to source voltage Vds, and thus, the primary (CHE) injection is increased, without increasing the secondary generation, thus, the shorter channel reduces the probability T of injection of secondary electrons into nitride layer.

Related Issues

Although not specifically directed to dealing with problems associated with secondary electron injection (SEI), a technique for decreasing charge distribution and diffusion during and after CHE injection is discussed in Scalable 2-bit silicon-oxide-nitride-oxide-silicon (SONOS) memory with physically separated local nitrides under a merged gate, Lee et al., (Samsung), Solid State Electronics 48 (2004), pp 1771-1775. Generally, the nitride layer (the whole ONO stack) is formed in two distinct sections (may be referred to as "strips", or "stripes"), rather than as one single planar structure, under the gate. Although the "brute force" approach discussed in the article may provide good 2 bit separation (for either CHE or SEI), it is a complicated structure which may result in a non-uniform (thickness) ONO stack.

A technique for reducing buried bitline resistance is set froth in U.S. patent Publication No. 2006/0084219 (published Apr. 20, 2006) which discloses an NROM structure and method of fabrication (hereinafter referred to as the '219 patent). Polysilicon columns are formed on top of an oxide-nitride-oxide (ONO) layer (stack), and function as gates for memory cells. Spacers are formed on the sides of the polysilicon columns. Bit line (or bitline) diffusions are implanted into the substrate between the spacing elements, and function as source and drain for the memory cells.

The '219 patent discloses implanting a pocket implant such as of boron or indium next to or under the polysilicon columns. An exemplary pocket implant may be of $1-3 \times 10^{13}/cm^2$ at an angle of 0-15 degrees.

In a virtual ground array (VGA) architecture, such as disclosed in the '219 patent, a given bitline may serve as the drain (or source) of one cell and as the source (or drain) of an adjacent cell. And, a given wordline may serve as the gate electrode for the two adjacent cells.

Commonly-owned patents disclose structure and operation of NROM and related ONO memory cells. Some examples may be found in commonly-owned U.S. Pat. Nos. 5,768,192 and 6,011,725, 6,649,972 and 6,552,387.

Commonly-owned patents disclose architectural aspects of an NROM and related ONO array, (some of which have application to other types of NVM array) such as segmentation of the array to handle disruption in its operation, and symmetric architecture and non-symmetric architecture for specific products, as well as the use of NROM and other NVM array(s) related to a virtual ground array. Some examples may be found in commonly-owned U.S. Pat. Nos. 5,963,465, 6,285,574 and 6,633,496.

Commonly-owned patents also disclose additional aspects at the architecture level, including peripheral circuits that may be used to control an NROM array or the like. Some examples may be found in commonly-owned U.S. Pat. Nos. 6,233,180, and 6,448,750.

Commonly-owned patents also disclose several methods of operation of NROM and similar arrays, such as algorithms related to programming, erasing, and/or reading such arrays. Some examples may be found in commonly-owned U.S. Pat. Nos. 6,215,148, 6,292,394 and 6,477,084.

Commonly-owned patents also disclose manufacturing processes, such as the process of forming a thin nitride layer that traps hot electrons as they are injected into the nitride layer. Some examples may be found in commonly-owned U.S. Pat. Nos. 5,966,603, 6,030,871, 6,133,095 and 6,583,007.

Commonly-owned patents also disclose algorithms and methods of operation for each segment or technological application, such as: fast programming methodologies in all flash memory segments, with particular focus on the data flash segment, smart programming algorithms in the code flash and EEPROM segments, and a single device containing a combination of data flash, code flash and/or EEPROM, Some examples may be found in commonly-owned U.S. Pat. Nos. 6,954,393 and 6,967,896.

A more complete description of NROM and similar ONO cells and devices, as well as processes for their development may be found at "Non Volatile Memory Technology", 2005 published by Saifun Semiconductor and materials presented at and through http://siliconnexus.com, both incorporated by reference herein in their entirety.

GLOSSARY

Unless otherwise noted, or as may be evident from the context of their usage, any terms, abbreviations, acronyms or scientific symbols and notations used herein are to be given their ordinary meaning in the technical discipline to which the disclosure most nearly pertains. The following terms, abbreviations and acronyms may be used throughout the descriptions presented herein and should generally be given the following meaning unless contradicted or elaborated upon by other descriptions set forth herein. Some of the terms set forth below may be registered trademarks (®).

bit The word "bit" is a shortening of the words "binary digit." A bit refers to a digit in the binary numeral system (base 2). A given bit is either a binary "1" or "0". For example, the number 1001011 is 7 bits long. The unit is sometimes abbreviated to "b". Terms for large quantities of bits can be formed using the standard range of prefixes, such as kilobit (Kbit), megabit (Mbit) and gigabit (Gbit). A typical unit of 8 bits is called a Byte, and the basic unit for 128 Bytes to 16 K Bytes is treated as a "page".

bit line or bitline (BL). A conductor connected to (or which may actually be) the drain (or source) of a memory cell transistor.

byte A byte is commonly used as a unit of storage measurement in computers, regardless of the type of data being stored. It is also one of the basic integral data types in many programming languages. A byte is a contiguous sequence of a fixed number of binary bits. In recent years, the use of a byte to mean 8 bits is nearly ubiquitous. The unit is sometimes abbreviated to "B". Terms for large quantities of Bytes can be formed using the standard range of prefixes, e.g., kilobyte (KB), megabyte (MB) and gigabyte (GB).

Cell Well (CW) the cell well is an area in the silicon substrate that is prepared for functioning as a transistor or memory cell device by doping with an electron acceptor material such as boron or indium (p–, electron acceptors) or with an electron donor material such as phosphorous or arsenic (n, electron donors). The depth of a cell well is defined by how deep the doping is.

CHE short for channel hot electron. CHE is an "injection mechanism".

CHISEL short for channel initiated decondary electron.

CMOS short for complementary metal oxide semiconductor. CMOS consists of n-channel and p-channel MOS transistors. Due to very low power consumption and dissipation as well minimization of the current in "off" state CMOS is a very effective device configuration for implementation of digital functions. CMOS is a key device in state-of-the-art silicon microelectronics.

CMOS Inverter: A pair of two complementary transistors (a p-channel and an n-channel) with the source of the n-channel transistor connected to the drain of the p-channel one and the gates connected to each other. The output (drain of the p-channel transistor) is high whenever the input (gate) is low and the other way round. The CMOS inverter is the basic building block of CMOS digital circuits.

NMOS: n-channel CMOS.

PMOS: p-channel CMOS.

EEPROM short for electrically erasable, programmable read only memory. EEPROMs have the advantage of being able to selectively erase any part of the chip without the need to erase the entire chip and without the need to remove the chip from the circuit. The minimum erase unit is 1 Byte and more typically a full Page. While an erase and rewrite of a location appears nearly instantaneous to the user, the write process is usually slightly slower than the read process; the chip can usually be read at full system speeds.

EPROM short for erasable, programmable read only memory. EPROM is a memory cell in which information (data) can be erased and replaced with new information (data).

Erase a method to erase data on a large set of bits in the array, by applying voltage scheme that inject holes in the bit set. This method causes all bits to reach a low Vt level.

FET short for field effect transistor. The FET is a transistor that relies on an electric field to control the shape and hence the conductivity of a "channel" in a semiconductor material. FETs are sometimes used as voltage-controlled resistors. The terminals of FETs are called gate, drain and source.

Flash memory Flash memory is a form of non-volatile memory (EEPROM) that can be electrically erased and reprogrammed. Flash memory architecture allows multiple memory locations to be erased or written in one programming operation.

FN tunneling Field emission—also called Fowler-Nordheim tunneling—is the process whereby electrons tunnel through a barrier in the presence of a high electric field. This quantum mechanical tunneling process is an important mechanism for thin barriers as those in metal-semiconductor junctions on highly-doped semiconductors. Using FN tunneling, electrons can be moved to the floating gate of a MOSFET memory cell.

half cell this term is sometimes used to refer to the two distinct charge storage areas in an NROM memory cell.

HHI short for hot hole injection

MLC short for multi-level cell. In the context of a floating gate (FG) memory cell, MLC means that at least two bits of information can be stored in the memory cell. In the context of an NROM memory cell, MLC means that at least four bits of information can be stored in the memory cell.

MOSFET short for metal oxide semiconductor field-effect transistor. MOSFET is by far the most common field-effect transistor in both digital and analog circuits. The MOSFET is composed of a channel of n-type or p-type semiconductor material, and is accordingly called an NMOSFET or a PMOSFET. (The 'metal' in the name is an anachronism from early chips where gates were metal; modern chips use polysilicon gates, but are still called MOSFETs).

nitride commonly used to refer to silicon nitride (chemical formula Si3N4). A dielectric material commonly used in integrated circuit manufacturing. Forms an excellent mask (barrier) against oxidation of silicon (Si).

n-type semiconductor in which concentration of electrons is higher than the concentration of "holes". See p-type.

NROM short for nitride read only memory.

NVM short for non-volatile memory. NVM is computer memory that can retain the stored information even when not powered. Examples of non-volatile memory include read-only memory, flash memory, most types of magnetic computer storage devices (such as hard disks, floppy disk drives, and magnetic tape), optical disc drives, and early computer storage methods such as paper tape and punch cards. Non-volatile memory is typically used for the task of secondary storage, or long-term persistent storage. The most widely used form of primary storage today is a volatile form of random access memory (RAM), meaning that when the computer is shut down, anything contained in RAM is lost. Unfortunately most forms of non-volatile memory have limitations which make it unsuitable for use as primary storage. Typically non-volatile memory either costs more or performs worse than volatile random access memory. (By analogy, the simplest form of a NVM memory cell is a simple light switch. Indeed, such a switch can be set to one of two (binary) positions, and "memorize" that position.)

ONO short for oxide-nitride-oxide. ONO is used as a charge storage insulator consisting of a sandwich of thermally insulating oxide, and charge-trapping nitride.

oxide commonly used to refer to silicon dioxide (SiO2). Also known as silica. SiO2 is the most common insulator in semiconductor device technology, particularly in silicon MOS/CMOS where it is used as a gate dielectric (gate oxide); high quality films are obtained by thermal oxidation of silicon. Thermal SiO2 forms a smooth, low-defect interface with Si, and can be also readily deposited by CVD.

p-type semiconductor in which concentration of "holes" is higher than the concentration of electrons. See n-type. Examples of p-type silicon include silicon doped (enhanced) with boron (B), Indium (In) and the like.

Program a method to program a memory cells, or half cells, typically by applying a voltage scheme that injects electrons to increase the Vt of the cells or half cells being programmed.

PROM short for programmable read-only memory.

RAM short for random access memory. RAM refers to data storage formats and equipment that allow the stored data to be accessed in any order—that is, at random, not just in sequence. In contrast, other types of memory devices (such as magnetic tapes, disks, and drums) can access data on the storage medium only in a predetermined order due to constraints in their mechanical design.

Read a method to read the digital data stored in a memory cell.

ROM short for read-only memory.

SEI short for secondary electron injection (or simply "secondary injection"). SEI occurs as a result of impact ionization by CHE electrons (e1) near the drain diffusion, generating an electron-hole pair (e2-h2), the hole (h2) of which continues into the substrate whereat another impact ionization results in another electron-hole pair (e3-h3), and the e3 electron becomes injected into the charge storage area(s) of the memory cell.

Si Silicon, a semiconductor.

SLC short for single level cell. In the context of a floating gate (FG) memory cell, SLC means that one bit of information can be stored in the memory cell. In the context of an NROM memory cell, SLC means that at least two bits of information can be stored in the memory cell.

SONOS Si-Oxide-Nitride-Oxide-Si, another way to describe ONO with the Si underneath and the Poly gate on top.

TEHH short for Tunnel Enhanced Hot Hole injection. TEHH is an "injection mechanism".

Units of Length Various units of length may be used herein, as follows:
  meter (m) A meter is the SI unit of length, slightly longer than a yard. 1 meter=~39 inches. 1 kilometer (km)=1000 meters=~0.6 miles. 1,000,000 microns=1 meter. 1,000 millimeters (mm)=1 meter. 100 centimeters (cm)=1 meter.
  micron (µm) one millionth of a meter (0.000001 meter); also referred to as a micrometer.
  mil 1/1000 or 0.001 of an inch; 1 mil=25.4 microns.
  nanometer (nm) one billionth of a meter (0.000000001 meter).

Angstrom (Å) one tenth of a billionth of a meter. 10 Å=1 nm.

Voltage abbreviated v, or V. A voltage can be positive or negative (or zero). Usually, a negative voltage is preceeded by a minus sign (–). Sometimes a positive voltage is preceeded by a plus sign (+), or no sign at all. A number of voltages are relevant with regard to operating a memory cell, and are typically designated by the capital letter "V", followed by another letter or letters. Some exemplary voltages of interest are:

Vt short for threshold voltage
Vti short for initial threshold voltage
Vs short for source voltage
Vd short for drain voltage
Vg short for gate voltage
Vds the potential difference between source and drain (or drain and source)
Vdp short for drain potential
Vb short for bulk (or substrate) voltage sometimes written Vsub
Vbi short for built-in potential (n+ to p– typically ~1 eV)
Vbl short for bitline voltage. (the bitline may function as source or drain)
Vwl short for wordline voltage (which typically is the same as Vg)

word line or wordline, (WL). A conductor normally connected to the gate of a memory cell transistor. The wordline may actually be the gate electrode of the memory cell.

write a combined method of first erase a large set of bits, then program a new data into the bit set.

BRIEF DESCRIPTION (SUMMARY) OF THE INVENTION

The disclosure is generally directed to techniques for using secondary electron injection (SEI) for programming NVM cells having separate charge storage areas in an ONO layer, such as NROM cells. Various combinations of low wordline voltage (Vwl), negative substrate voltabe (Vb), and shallow and deep implants facilitate the process. Second bit problems may be controlled, and retention and punchthrough may be improved. Lower SEI programming current may result in relaxed constraints on bitine resistance, number of contacts required, and power supply requirements.

According to the disclosure, a method of injecting electrons into charge storage areas of a non-volatile memory (NVM) cell, such as a NROM cell comprising an ONO layer, comprises: utilizing secondary electron injection to perform a given electron injection operation, such as programming. Using SEI for programming goes against the conventional thinking that SEI cannot be controlled in an NROM cell.

According to an aspect of the disclosure, SEI may be enhanced, while substantially reducing channel hot electron (CHE) injection during programming the memory cell, including programming selected charge storage areas in the cell According to an aspect of the disclosure, during programming, a gate voltage Vg (or wordline voltage Vwl) is applied which is sufficiently low that CHE is substantially eliminated.

According to an aspect of the invention, the gate voltage (Vg) may be less than a threshold voltage (Vt) plus 4 volts. The threshold voltage (Vt) may be approximately 1.8 volts. Such a low gate voltage is generally insufficient to support channel hot electron (CHE) injection.

According to an aspect of the disclosure, during programming, a drain voltage of approximately 3.0-4.5 volts may be applied.

According to an aspect of the disclosure, during programming, a negative substrate voltage (Vb) of approximately 0 to –2 volts may be applied.

According to an aspect of the disclosure, shallow pocket implants (PI-1) may be implanted in the channel, adjacent the diffusions. The shallow pocket implants may comprise boron or indium, or combinations thereof.

According to an aspect of the disclosure, a first threshold voltage implant (#1) may be implanted shallow in the channel. The first threshold voltage implant (#1) may have a low boron concentration, such as $5\text{-}10\times10^{12}/cm^2$ boron.

According to an aspect of the disclosure, means may be provided for enhancing generation of secondary electrons (e3) deep in the substrate. The means for enhancing generation of secondary electrons (e3) may comprise a deep pocket implant (PI-2) formed deep within the substrate, or a Vt implant (Vt #3) formed deep within the substrate. These implants may be boron or indium.

According to the disclosure, electrons may be injected into a charge storage area of a NVM cell against an electrical field which is opposing injection.

Various combinations of the voltages and implants discussed herein may be used to enhance secondary injection, reduce second bit problems, and improve retention and punchthrough.

An advantage of the techniques disclosed herein is that by using secondary electron injection (SEI) instead of channel hot electron (CHE) injection, a programming current can be used which is at least 2-10× lower than a programming current that would be required to support channel hot electron (CHE) injection of the electrons into the charge storage area. This relaxes constraints on bitine resistance, number of contacts required, and power supply requirements.

According to the disclosure, a non-volatile memory (NVM) cell comprises: two spaced-apart diffusions in a substrate; a channel defined between the two diffusions; an ONO layer disposed atop the channel; a first charge storage area defined in the ONO layer adjacent one of the two diffusions, and a second charge storage area defined in the ONO layer adjacent an other of the two diffusions; and means for enhancing generation of secondary electrons. The NVM cell may be a nitride read only memory (NROM) cell.

According to an aspect of the disclosure, the ONO layer comprises a bottom oxide layer, a middle nitride layer and a top oxide layer; and may have the following dimensions: the bottom oxide layer has a thickness of from 3 to 6 nm; the middle nitride layer has a thickness of from 3 to 8 nm; and the top oxide layer has a thickness of from 5 to 15 nm. The bottom oxide layer may have a thickness of approximately 4 nm.

According to an aspect of the disclosure, the NVM cell may be formed in a cell well having a background concentration of approximately $1.0\text{-}1.5\times10^{17}/cm^3$ boron.

BRIEF DESCRIPTION OF THE DRAWINGS

Reference will be made in detail to embodiments of the disclosure, examples of which may be illustrated in the accompanying drawing figures (FIGS). The figures are intended to be illustrative, not limiting. Although the disclosure is generally described in the context of these embodiments, it should be understood that it is not intended to limit the disclosure to these particular embodiments.

Certain elements in selected ones of the figures may be illustrated not-to-scale, for illustrative clarity. The cross-sectional views, if any, presented herein may be in the form of "slices", or "near-sighted" cross-sectional views, omitting certain background lines which would otherwise be visible in a true cross-sectional view, for illustrative clarity.

Figure 1:
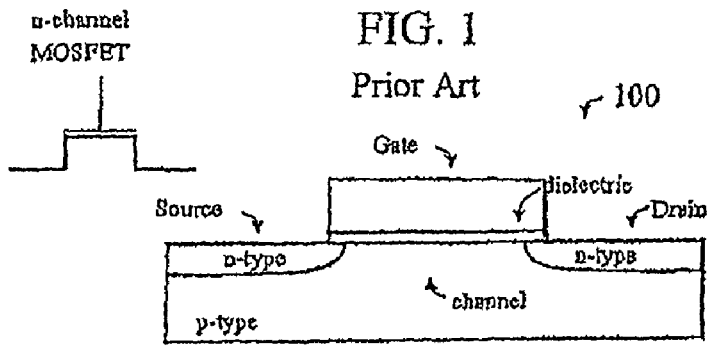
Figure 2:
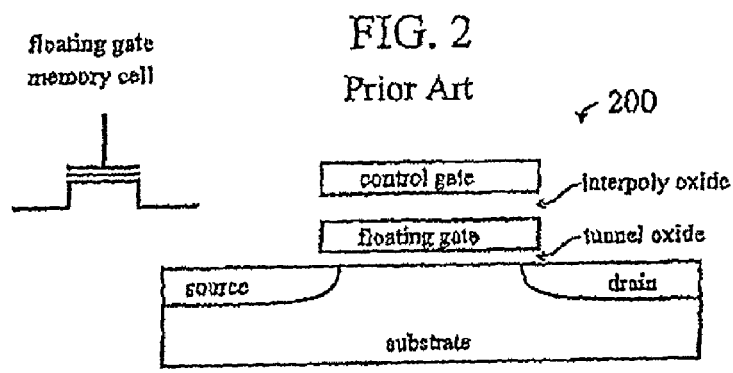

Elements of the figures may (or may not) be numbered as follows The most significant digits (hundreds) of the reference number correspond to the figure number. For example, elements of FIG. 1 are typically numbered in the range of 100-199, and elements of FIG. 2 are typically numbered in the range of 200-299. Similar elements throughout the figures may be referred to by similar reference numerals. For example, the element 199 in FIG. 1 may be similar (and possibly identical) to the element 299 in FIG. 2. Throughout the figures, each of a plurality of elements 199 may be referred to individually as 199a, 199b, 199c, etc. Such relationships, if any, between similar elements in the same or different figures will become apparent throughout the specification, including, if applicable, in the claims and abstract.

(Throughout the descriptions set forth in this disclosure, lowercase numbers or letters may be used, instead of subscripts. For example Vg could be written $V_g$. Generally, lowercase is preferred to maintain uniform font size.) Regarding the use of subscripts (in the drawings, as well as throughout the text of this document), sometimes a character (letter or numeral) is written as a subscript—smaller, and lower than the character (typically a letter) preceeding it, such as "$V_s$" (source voltage) or "$H_2O$" (water). For consistency of font size, such acronyms may be written in regular font, without subscripting, using uppercase and lowercase—for example "Vs" and "H2O".

FIG. 1 is a stylized cross-sectional view of a field effect transistor (FET), according to the prior art. To the left of the figure is a schematic symbol for the FET.

FIG. 2 is a stylized cross-sectional view of a floating gate memory cell, according to the prior art. To the left of the figure is a schematic symbol for the floating gate memory cell.

Figure 2A:
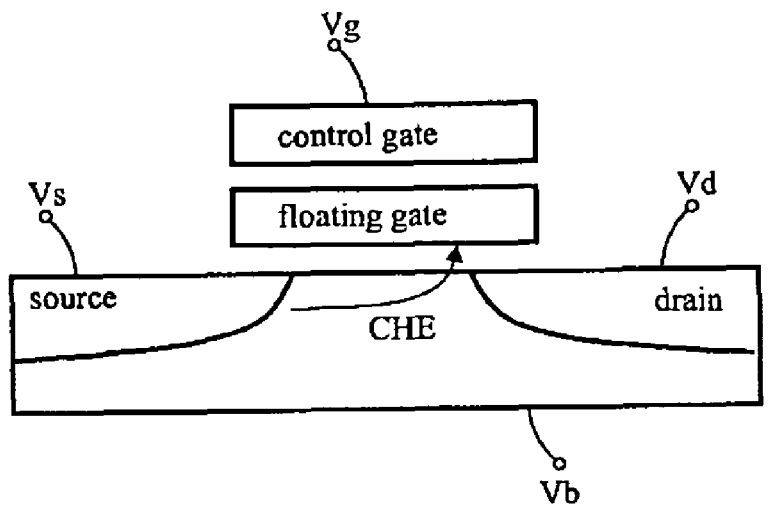
Figure 2B:
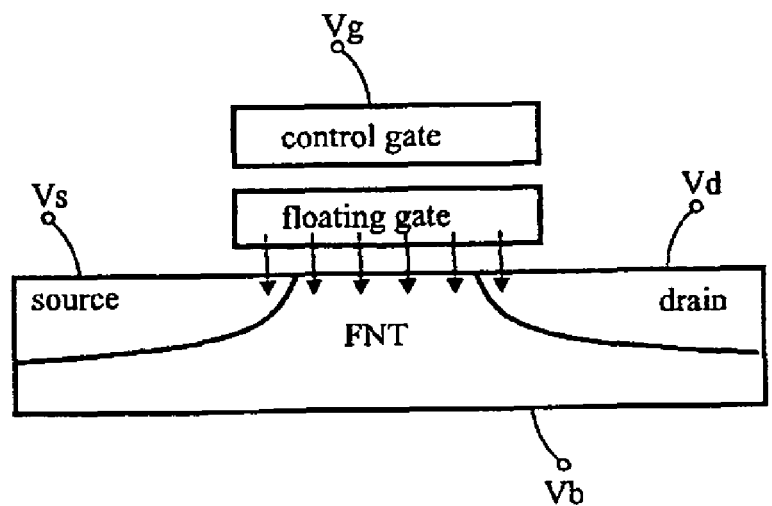

FIGS. 2A and 2B are diagrams illustrating programming and erase mechanisms for a floating gate memory cell, according to the prior art.

Figure 3:
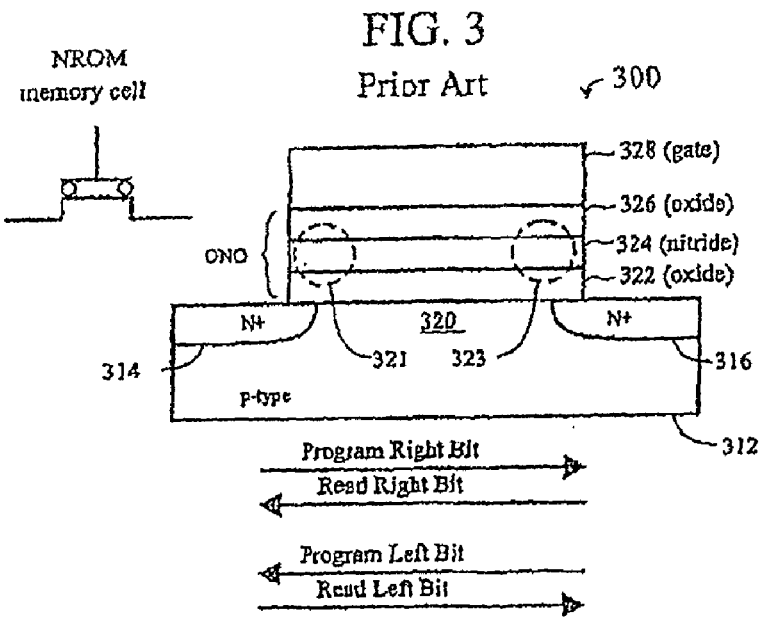

FIG. 3 is a stylized cross-sectional view of a two bit NROM memory cell of the prior art. To the left of the figure is a schematic symbol for the NROM memory cell.

FIGS. 3A-3D are diagrams illustrating programming and erase mechanisms for a NROM memory cell, according to the prior art.

Figure 4:
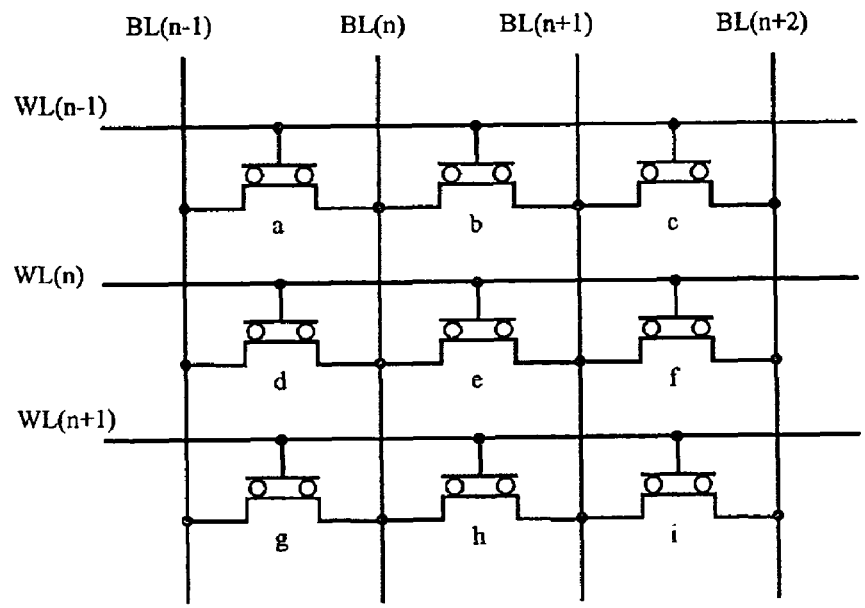

FIG. 4 is a diagram of a memory cell array with NROM memory cells, according to the prior art.

Figure 5:
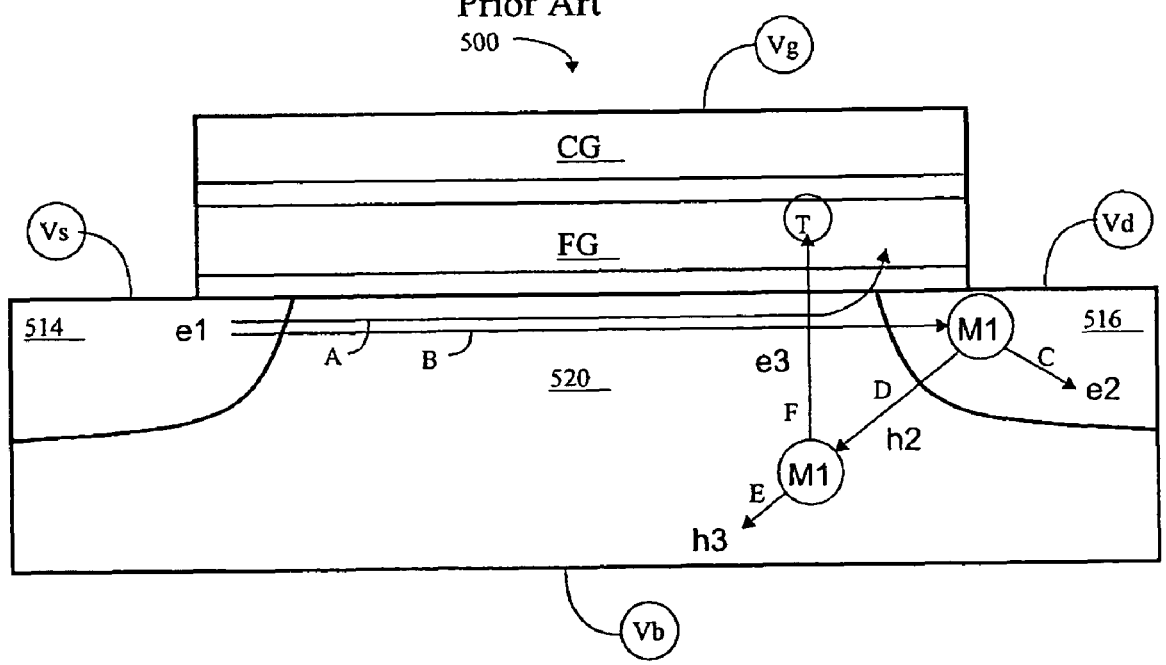

FIG. 5 is a stylized cross-sectional view of a floating gate memory cell illustrating a mechanism for secondary electron injection, according to the prior art.

FIG. 6 is a stylized cross-sectional view of a NROM cell, according to an embodiment of the disclosure.

FIG. 7 is a stylized cross-sectional view of a NROM cell, according to an embodiment of the disclosure.

DETAILED DESCRIPTION OF THE INVENTION

As discussed hereinabove, channel hot electron (CHE) has been the standard (primary) injection mechanism for injecting electrons into the charge storage areas of floating gate memory cells, as well as for the charge storage (trapping) areas of nitride read only memory (NROM) cells.

As discussed hereinabove, secondary electron injection (SEI) is also capable of generating electrons for injection into the charge storage areas of floating gate memory cells, but has been considered to be a problem for NROM cells since secondary injection typically inserts electrons far from the bit line diffusion (drain) which makes erasure difficult, resulting in cycling degradation.

Some difficulties of and solutions for dealing with secondary injection in NROM cells have been discussed in commonly-owned U.S. Pat. Nos. 6,429,063 and 6,583,007, as discussed hereinabove.

One difficulty of secondary injection, as it relates to NROM cells with two distinct charge storage areas, is the width of the electron distribution. In a floating gate cell having a conductor forming a single charge storage area, it is generally unimportant exactly where the electrons are injected, because the storage medium is a conductor and electrons are free to move around in conductors.

In contrast thereto, for a NROM cell, where the charge storage medium is not a conductor, it is very important that electrons which are injected arrive at their intended location, such as either in the right bit storage area (323) or the left bit storage area (321). With channel hot electron (CHE) injection, the process is well-controlled, because electron injection occurs close to the drain (bitline) diffusion. On the other hand, when there is an undesirable width of electron distribution, as has been observed as a result of secondary electron injection (SEI), this causes "second bit" and retention after cycling (RAC) problems.

Generally, the "second bit" problem (or effect) is a situation where, when electrons are being injected into a given one of the two charge storage areas of an NROM cell, some electrons get injected into the other of the two charge storage areas.

Generally, the "retention after cycling" (RAC) problem is a situation where, when the width of the electron distribution extends too far (but not so far as to cause a second bit problem), the subsequent erase mechanism (such as HHI) may not be able to remove some of the far-from-diffusion electrons, as discussed (at length) in the aforementioned '063 patent (see FIGS. 5A, 5B, 5C, 5D therein).

Channel Hot Electron (CHE) injection also has problems (limitations). A problem with CHE injection programming of NROM cells is the high programming current (Iprog) which is involved. When using diffusion bitlines (as contrasted with metal bitlines), resistance is a problem. For high currents, many contacts (to the bitline) are needed, so that a given cell is not too far from a bitline contact. This leads to scaling difficulties.

In a typical CHE scenario, there may be a contact at every 16 (or 32) cells along a bitline. Generally, bitline contacts represent wasted space. A contact typically occupies the space of two memory cells. So, if there is one contact for every 16 cells, the bitline contacts represent approximately a 6% waste of space ("real estate") which would otherwise be available for memory cells.

By reducing programming current, the number of bitline contacts which are needed could be reduced. For example, if the number of bitline contacts which are needed could be reduced by a factor of four, resulting in only one bitline contact for every 60 cells, the bitline contacts would occupy only 1.5% of available space for memory cells.

Reducing programming current would avoid problems of resistance in tight pitch situations, and avoid solutions such as double bitline implants to reduce BL resistance. See, for example, U.S. patent application Publication No. 2006/0084219. (For example, a bitline implant is made through an opening, sidewall spacers are formed on the opening, and another bitline implant is made through the now narrower opening.)

Working with Secondary Injection

Some goals of the techniques disclosed herein include working with (rather than against) secondary electron injection—using secondary injection as a viable injection mechanism for NROM cells, without requiring any significant structural changes to the cell, and with only simple changes to the process flow for making the cells. And, using secondary electron injection instead of (as an alternative to) CHE injection.

As will be evident from the descriptions set forth herein, the voltages being used for secondary injection are such that CHE will not function efficiently, but it is acceptable that some CHE may occur. Generally, CHE may account for less than 1% of the overall injection, with SEI providing at least 99% of the electrons which are injected. There are no negative effects for the CHE injection under the SEI programming conditions. CHE may account for as much as up to less than 35% of the overall injection, with SEI providing at least 65% of the electrons which are injected, in which case SEI is still the predominant injection mechanism.

A general objective of the techniques disclosed herein is to reduce both the programming current and programming voltages required to effect programming of a memory cell. These two power-related issues (voltage and current) are significant because internal switching power supplies (and capacitors) may consume more current than the injection mechanism itself, and efficiencies are typically not 100%. Therefore, any reduction in programming current and/or programming voltage can have manifold benefits, throughout the entire memory chip.

In order to make secondary injection viable for NROM cells, one problem which must be solved is what is called the "2nd (second) bit effect". In NROM cells, it is very important, when injecting electrons into a given (for example, right) charge storage area to avoid also injecting electrons into the other (for example, left) charge storage area. Since it is not possible to avoid some injection into the other charge storage area, and because of reverse read (discussed hereinabove), this problem must be addressed.

In order to make secondary injection viable for NROM cells, another problem which must be solved is what is called the "RAC problem". "RAC" stands for reliability/retention after cycling. Since the width of the electron distribution is wider (in comparison with CHE), in addition to the read problem discussed above, the half-cell is more difficult to erase ("erase degradation"). (Erase is typically done using hot hole injection (HHI).)

Both of the problems set forth above (2nd bit effect, erase degradation) are the result of electron injection occurring far from the junction.

As discussed in greater detail hereinbelow, to resolve the problem(s), while having an efficient programming mechanism two issues are addressed:
  programming conditions.
  cell structural modifications (implants).

Generally, in order to reduce the 2nd bit effect and the erase degradation (RAC problem), while maintaining an efficient low current and low Vbl in programming, the techniques disclosed herein achieve the following:

1. Force the electron injection to be close to the junction. This generally means causing electrons to be injected close to the junction (drain diffusion) and avoiding injecting electrons far from the junction (towards, or into the other bit storage area).

2. Make the threshold insensitive to electrons which may be injected far from the junction. This generally means that if not all of the electrons are injected close to junction, making the read mechanism less sensitive to electrons which are far from the junction. This is not a change in the read mechanism itself, but rather is a result of the cell construction.

3. Create secondary electrons in an efficient way. This generally means creating secondary electrons with low power requirements, thereby relaxing constraints on internal power supplies as well as reducing the number of contacts required.

Regarding creating secondary electrons in an efficient way, there are generally two requirements for the creation of hot carriers: (i) high potential, and (ii) high electric fields.

Creating a High Potential Drop to Support Secondary Injection

As described hereinabove, holes which are accelerated towards the substrate create the secondary electrons. Generally, there are three accelerating voltages involved in the generation of secondary electrons.

accelerating voltage 1 (V1):
  Vds, generating channel hot electrons (e1), such as on the order of 3-4.5 volts. (Vds is typically somewhat smaller than Vd.)

accelerating voltage 2 (V2):
  Vd−Vsub+Vbi, accelerating holes (h2), such as on the order of 5-7.5 volts. (Vd=~3-4.5 V)−(Vsub=from −1 V to −2 V)+(Vbi=~1 V)

accelerating voltage 3 (V3):
  same as accelerating voltage 2, accelerating electrons (e3), such as on the order of 5-7.5 volts.

The total (theoretical) accelerating voltage for injection of secondary electrons (e3) is simply the sum of the three accelerating voltages V1+V2+V3, such as on the order of 13-19.5 volts. A "reasonable" number to use is 15 volts.

In contrast thereto, in CHE, the acceleration of electrons is controlled by the potential difference (drop) between the source and the drain, which is only about 3.5-4.5 volts. For NROM cells, typical CHE voltages are:

TABLE 4

Exemplary NROM Programming Conditions

| | Vs | Vg (Vwl) | Vd (Vbl) | Vb (Vsub) | time |
|---|---|---|---|---|---|
| CHE | +0.5 V | 8-10 V | +4-5 V | 0 V | 0.1-1 µs |
| Secondary Injection | 0-1 V | Vt + 3 V | 3.0-4.5 V | 0 V to −2 V | 0.1-1 µs |

With secondary injection, using the three accelerating voltages V1, V2, V3 mentioned hereinabove, a total potential drop of approximately 15 volts can readily be achieved.

In CHE, every electron which goes from source to drain has a relatively high probability to be injected. In secondary injection, although the acceleration can be quite high (due to the large potential drop), the probabilities (T) for injection are quite low in contrast to CHE.

Generally, whereas only one in every 100,000 to 1,000,000 primary electrons will be injected in CHE, the ratio is approximately only one of every 100 to 1,000 for SEI. This improved efficiency is only for the secondary electrons that are >1% of the channel electrons. This implies that the secondary programming is significantly more efficient, but has smaller source of electrons relative to primary. However, bearing in mind that only a few hundred electrons need to be injected (per programming event), these numbers are viable.

Having a high electric field helps to create the secondary electrons (e3). A high electric field can be created by boron (or indium) which is an electron acceptor Generally, since secondary electron generation occurs deep in the substrate, it can be enhanced by increasing the boron concentration deep in the substrate. This increases the electric field deep in the substrate, as close as possible to the "natural" substrate, where the energy bands are flat. (The potential there is the substrate voltage, no depletion.) By adding boron concentration deep into the substrate, the higher fields can be controlled at the substrate potential.

Programming Conditions:

A general objective of using secondary electron injection is to reduce the power requirements, thereby reducing the number of bitline contacts required, as well as relaxing constraints on internal power supplies. This, and other objectives may be achieved by using:

Low current—very low Vwl in programming.

Low voltage (Vbl)—put negative voltage on the substrate to accelerate the secondary electrons with the addition of Vsub & Vbl.

Injecting Close to the Junction Injection, Using Low Vwl

In an array architecture, the wordline (WL) is connected to (and may be) the gate of the memory cell. According to this aspect of the disclosure, the wordline voltage (Vwl) is optimized, as low as possible, even at the expense of programming efficiency, to force a steeper dependence of the injection on the electron energy. Since the energy is maximized next to the junction (drain, bitline) and is dramatically lower inside the channel, this results in closer to junction injection. This is contrary to the common knowledge (previous understanding) that higher Vwl results in injection closer to the junction because of the lower Vbl (Vd) and increased Vg-Vbl injection conditions next to the junction (drain).

The common understanding is that if you increase Vwl, you will get a narrower electron distribution next to the junction (drain). According to this disclosure, if Vwl is decreased, the result will be a better (narrower) electron distribution next to the drain. This results from most of the potential drop falling closer to the junction, rather than deep into the channel.

The problem is that it is easy to create hotter electrons next to the drain by doing that. This is known. But then, the field required to attract electrons towards the gate that will not oppose their injection (into the charge storage area) is much lower or even negative, and the common understanding is that then you can not inject.

Having a thin bottom oxide is a great advantage. It is almost impossible to inject CHE against the electrical field of the gate, and the reason is that the energy of channel hot electrons is not very high, because they derive their energy from the small potential difference (Vds, approximately 4-5 volts) between source and drain, as discussed above. By using a low Vwl, CHE is substantially reduced.

In the case of NROM, with approximately 15 volts of energy driving the secondary electrons and a very thin (such as 4 nm) bottom oxide on the ONO stack, the probability of interaction with bottom oxide is very low (and the probability of passing through the bottom oxide is commensurately high). Since the mean free path (MFP) of the secondary electrons is almost the same order of magnitude as the bottom oxide thickness, injection can successfully be performed. If the bottom oxide were thicker (such as with the relatively thick (8-10 nm) oxide of a floating gate cell), there would be a very dramatic drop in the probability of injection.

Reducing Vwl, and confining most of the potential drop as close as possible to the drain junction, provides an efficient mechanism for injecting close to the junction.

Therefore, according to this aspect of the disclosure, secondary injection of electrons is encouraged by using a low Vwl (such as Vt plus 2 to 3 volts) combined with thinnest possible bottom oxide (such as 3-4 nm). (In the past, it was normal to use a Vwl of Vt +7 volts.)

Inversion and Relative Voltages

Some of the voltages set forth herein are in terms of "Vt+x" (Vt plus a number). Vt is generally defined as the threshold voltage that is required to cause the channel to conduct. For example, Vt is approximately 1.8 volts, such as Vt=1.8+/−0.8 volts. If the field in the bottom oxide (322) is either zero, or positive (attracting electrons), this will not affect the probability of injection, whether CHE or SEI. However, the situation is not static, it is dynamic. As electrons are injected into the nitride (324), the field in the bottom oxide can become "opposing" (negative, repelling electrons). If the potential drop between the injection point and the nitride (324) is non-zero 0 and negative (opposing electron injection), in order to effect injection, this number x has to be added to the potential barrier. If, for example, the silicon (substrate) to oxide potential barrier zero field is 3.2 eV (electron volts), and if there is another 0.5 volts of opposing potential (such as from electrons in the nitride), then an electron can be injected into the nitride only if it has 3.7 eV. And, a positive voltage Vg has to be applied at the gate (326) just to overcome the inversion and permit injection of electrons into the nitride (324). This is true for CHE as well as SEI—it applies to any electron being injected past the bottom oxide (322) into the nitride (324).

Because there is a relation between Vg and Vd, in the programmed state of the device, one must start with an initial point which is close enough to the inversion point, and this will define the state of the device, without absolute voltages. Regarding the relationship between Vd and Vg, the gate potential will normally be no more than 1 volt higher than the maximum drain potential. And this will reflect a field inversion based on programming of less than 1 volt. Since programming normally takes place with a higher voltage than this, it overcomes the inversion.

As mentioned above, having a low Vwl (or Vg, such as Vt+3 V for secondary injection, rather than 8-10 V normally used in CHE injection, both positive, see Table 4), reduces and substantially eliminates injection of CHE electrons. Generally, this is because of field inversion. Normally, with CHE techniques, there is a collecting field established in the nitride (due to the high Vwl). With low Vwl, this field becomes inverted, ceases to support injection of CHE electrons, which have only about 5 volts of accelerating energy, and acts to force CHE electrons back into the channel. CHE Injection becomes so inefficient that it practically stops. In contrast thereto, because the energy of the secondary electrons (e3) is so high (such as 15 V), they can inject against the vertical field of the gate, their energy is sufficiently high to surmount the increased potential barrier.

Reducing the Read Sensitivity to Far Electron Injection by PI Optimization

This part of the disclosure is fairly conventional, and has been used in conjunction with controlling CHE injection. Generally, the idea here is to tailor the concentration of the shallow pocket implant so that the highest Vt is close to the junction, and the Vt far from the junction is much lower, by controlling boron concentration gradient. A pocket implant, self-aligned to the junction (such as disclosed in U.S. Pat. No. 6,215,148) provides the desired high Vt close to the junction. When injecting electrons (using either CHE or secondary injection), the process is sensitive to the higher Vt, which is close to the junction. This helps to reduce the $2^{nd}$ bit effect, during the read operation by making the read operation more sensitive to electrons over the pocket implant, and less sensitive to electrons which may be far from the junction.

Improve RAC by Reducing the PI Concentration and Increasing the CW Concentration In the previous item (reducing read sensitivity to far from junction electrons by using PI to increase Vt close to junction) the object was to increase the gradient of PI next to the junction to far from junction. Generally, more is better, but there is a limit. As the boron concentration gets higher, the distribution of electrons gets smaller (narrower) which, for a read operation, is a good thing.

But, when the boron concentration gets higher and higher, then the amount of electrons that you need to increase the Vt by a delta becomes smaller and smaller. The amount, also, in this case, equates to narrower distribution. In this situation, once you start doing erase (hole injection), and you do it continuously (through cycling), the holes do not perfectly match the electrons. The holes are moving, and some of them move towards the channel. The movement of even a few holes into the junction will create a Vt reduction, which is very substantial.

So, if the concept of increasing the PI gradient is taken too far, the electrons may be concentrated too close to the junction. The narrow electron distribution with the hole distribution next to it (after erase), makes the retention very poor. Any hole movement due to the high electric field of the holes to electrons distribution will create a very large voltage drop. The RAC (retention after cycling) will be poor in such a case that the electron distribution is too narrow. To optimize, for retention, it would be desired to have a PI as low as possible. But, the PI is not only serving Vt and RAC, it also has to serve punchthrough prevention.

For RAC, it is generally better to reduce the boron concentration in the shallow PI. To compensate for this, the background concentration in the cell well (CW) needs to be increased, so that punchthrough (erase punchthrough) will not be degraded.

In erase (such as hot hole injection), the gate voltage Vg is negative, which is great for surface punchthrough, which means that if you tailor your cell width such that you maintain a low CW concentration next to the ONO, but you increase the mid and deep range CW, then this results in better retention because the surface concentration is lower, but punchthrough is accommodated by the deeper (higher) concentration.

The lesson here is that something else has to be done, other than shallow pocket implant, to accommodate not only secondary injection, but also to accommodate erase and RAC.

Improving the Secondary Electron Generation in the Substrate by Optimizing the Deep CW Concentration to be Higher While not Compromising the Surface Concentration.

This part of the disclosure is fairly conventional. With a deeper cell well (CW), the boron concentration can be increased even further, so that the impact-ionization can be as close as possible to the substrate potential. (Refer to FIG. 5, h2, M1) This is effective because there is a clear correlation between potential drops and fields through higher boron concentration.

EXAMPLES

To accomplish the objectives set out herein, various changes can be made to the structure of the NROM cell. Generally, the individual processes and individual structures resulting therefrom are conventional, and do not need extensive explanation. As will be evident, it is largely the method of operation that makes the NROM cell function well using secondary electron injection as the primary programming tool.

Example 1

Double Pocket Implant

FIG. 6 illustrates an NROM memory cell having two pocket implants (PIs)—a shallow pocket implant (PI-1) and a deep pocket implant (PI-2).

Generally, the cell 600 (compare 300) comprises two spaced-apart diffusions 614 and 616 (compare 314 and 316) in a substrate 612 (compare 312), a channel 620 (compare 320) between the two diffusions, and an ONO stack comprising bottom oxide 622 (compare 322), nitride 624 (compare 324) and top oxide 626 (compare 326) disposed above the channel 620 and slightly wider than the channel 620 (slightly overhanging the diffusions 614, 616). The gate (polysilicon word line (WL) is omitted, for illustrative clarity (see 322, FIG. 3).

The diffusions 614 and 616 function as source and drain (or drain and source, depending on what operation is being performed on which bit storage area, as described hereinabove), and may also be referred to as bitline diffusions, since they typically are the bitline diffusions. In this figure, the left bit line diffusion 614 acts as the source and the right bit line 616 diffusion acts as the drain, for a programming operation of inserting electrons into the right bit storage area (compare 323, FIG. 3). Conversely, the right bit line diffusion 616 acts as the source and the left bit line diffusion 614 acts as the drain, for a programming operation of inserting electrons into the left bit storage area (compare 321, FIG. 3).

The polarity illustrated here is "n-channel", meaning that the memory cell transistor structure is formed in (and atop) a cell well (CW) which is doped with an electron acceptor such as boron. The opposite polarity, and using secondary hole injection would work (but is not effective) and is deemed to be included in this disclosure, for completeness.

A first (or shallow) pocket implant (PI-1) is formed close to the surface of the substrate for the purpose of retention after cycling (RAC) optimization and for $2^{nd}$ bit optimization. There is one of the shallow pocket implants 834 next to (adjacent, abutting) the diffusion 814, and there is one of the shallow pocket implants 836 next to (adjacent, abutting) the diffusion 816.

Comparable pocket implants (120) are shown in U.S. Pat. No. 6,215,148 (see FIG. 4A, therein). The pocket implants may be boron, and may be implanted in two pocket implant steps, as described in U.S. Pat. No. 6,215,148 (the '148 patent) with angled implants, producing boron pocket implants 834, 836.

The shallow pocket implants PI-1 may comprise boron (or indium, or combinations thereof), implanted at a dosage of (approximately) $15 \times 10^{13}$ per $cm^2$ at 60 KeV and at an angle of 25-degrees to the right and left of vertical.

The '148 patent also discloses a double implant comprising first a boron implant (120) with a phosphorous implant (122). (See FIG. 4A therein) The idea being that the "double pocket" implant heightens the lateral field near the bit lines and significantly reduces the lateral field in the rest of the channel. The Boron implant is 30-120 KeV up to a dose of $1-5 \times 10^3$ per $cm^2$ and the Phosphorous implant is 30-100 KeV up to a dose of $0.5-2.5 \times 10^{13}$ per $cm^2$.

Although such a double implant (of boron, counterdoped with phosphorous) could be used in this technique for enhancing secondary electron injection, it is not necessary. If desired, a double implant of boron could be used to enhance the profile of (exercise more control over) the shallow pocket implants (PI-1)—the placement of boron in the exact location that is desired.

The shallow boron pocket implants PI-1, when implanted with relatively high energy, enhance the field in the substrate 612 and hence, enhance the probability M2 (see FIG. 5) of secondary electron (e3) generation. This higher boron concentration is also effective in accelerating secondary electrons and hence, enhances their probability T of injection.

A second pocket implant PI-2 is formed deep within the substrate to optimize (enhance) generation of secondary electrons (e3), and to optimize "bulk punchthrough" during erase. (Punchthrough can be on the surface or deeper into the bulk. Here, it can be called "subsurface punchthrough".) The second (or deep) pocket implant PI-2 is formed deep within the substrate, and is typically boron.

The deep pocket implant 644 is located approximately beneath the corresponding shallow pocket implant 634, on the channel side of the diffusion 614, spaced apart from both the shallow pocket implant 634 and the diffusion 614. It is angled, and is self-aligned to the bitline diffusion 614. It extends from approximately half the depth of the bitline diffusion 614 to the depth of the bitline diffusion 614, or even somewhat further into the substrate.

In a similar manner, the deep pocket implant 646 is located approximately beneath the corresponding shallow pocket implant 636, on the channel side of the diffusion 616, spaced apart from both the shallow pocket implant 636 and the diffusion 616. It is angled, and is self-aligned to the bitline diffusion 616. It extends from approximately half the depth of the bitline diffusion 616 to the depth of the bitline diffusion 616, or even somewhat further into the substrate.

Figure 3A:
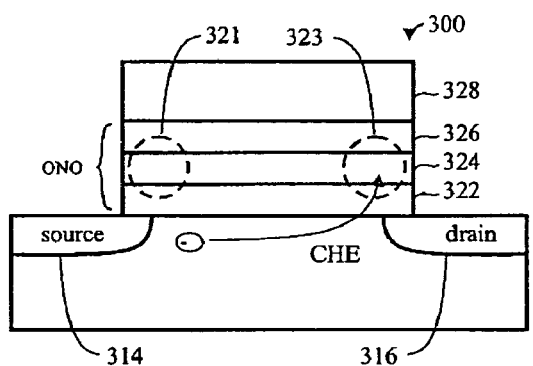
Figure 3B:
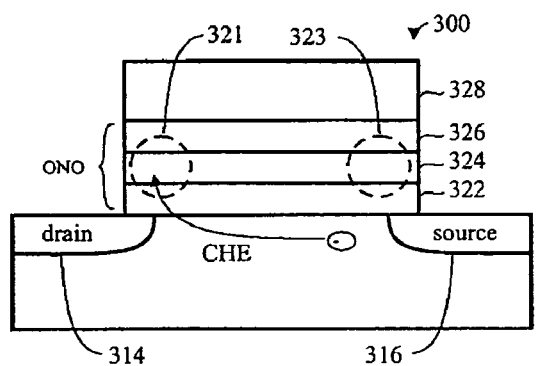
Figure 3C:
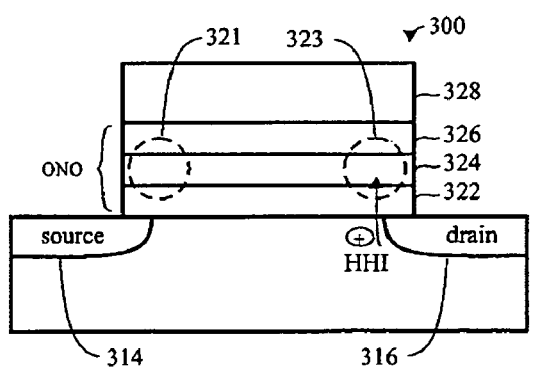
Figure 3D:
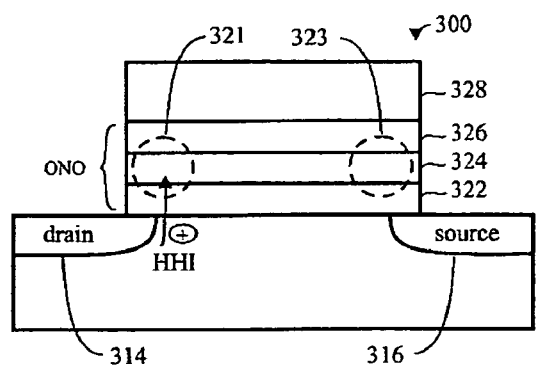

Comparable pocket implants (41) are shown in the '219 patent (see FIG. 3C, therein). The deep pocket implants PI-2 may be of $0.5\text{-}6\times10^{13}/cm^2$ (dose of the dopant per unit area) at an angle of 0-15° and energy of 10-20 Kev, and may be of boron or indium or compounds or alloys containing boron and/or indium.

Generally, the purpose of the shallow pocket implants 634 and 636 is to improve the second bit effect and/or the RAC problem (as well as program and erase punchthrough) by concentrating (enhancing) electron injection close to the junction 614 and 616, respectively. Generally, the purpose of the deep pocket implants 644 and 646 is to improve generation of secondary electrons (as well as improving punchthrough).

In this example, the background is low CW so that the pocket implants (PI-1, PI-2) are the dominant boron concentration. For example, the cell well (CW) has a background concentration of approximately $1.0\text{-}1.5\times10^{17}/cm^3$ boron (or indium).

As a general note, it can be observed that dopant concentrations in the range of $10^{13}$ to $10^{15}$ are usually specified as per (/)cm² (centimeters squared, dosage per area). Concentrations in the range of $10^{16}$ and above are usually specified as being per cm³ (centimeters cubed, dosage per volume). Generally, the per unit area numbers are used to indicate the applied (incident) dosage, and the per unit volume numbers are used to indicate the result dose in the silicon.

The channel 620 has an effective length Leff. As illustrated in FIG. 6, Lpi is the length of the shallow pocket implant diffusion PI-1, and Le is the length (referred to as "width") of the electron distribution resulting from secondary injection. In the figure, the electron distribution is shown by the curve 830 (dashed lines).

The idea being illustrated here is that the electron distribution Le is wider (longer) than the boron distribution Lpi (Lpi<Le), thereby reducing sensitivity (during read) to those electrons that are very far from the junction.

The following dimensions are exemplary:
the bottom oxide layer 622 may be from 3 to 6 nm, for example 4 nm thick
the middle nitride layer 624 may be from 3 to 8 nm, for example 4 nm thick
the top oxide layer 626 may be from 5 to 15 nm, for example 10 nm thick
depth of the bitline diffusions 614, 616: approximately 50 nm (commencing at the surface of the substrate 612)
length (Leff) of the channel 620: approximately 80 nm (in 60 nm technology)
length (Lpi) of the shallow pocket implant PI-1: approximately 15 nm
width (Le) of electron distribution: approximately 20 nm
depth of the shallow pocket implant PI-1: approximately ⅓ to ½ of the depth of the bitline diffusions (commencing at the surface of the substrate 612)
depth of the deep pocket implants (PI-2): commencing at approximately ⅓ of the depth of the bitline diffusions to at least as deep as the bitline diffusions.

The pocket implants (PI-1 and PI-2) are self-aligned to the ONO stack (which may be covered with polysilicon for the gate structure (not shown, see 328, FIG. 3).

Anti-punchthrough (APT) may be done at the other axis, between the wordlines (not shown, see, for example, the '219 patent).

Some assumptions being made in this example (FIG. 6) are:
1. CW is standard
2. PI-B (reduced relative to today)
3. The PT control by Deep PI, CW & APT
This embodiment utilizes:
Low CW background
Tilted Boron PI—as required for Read & RAC option.
Tilted Deep PI (higher energy different angle)—to have efficient secondary generation and improved deep PT in erase.
APT—Increase secondary outside the channel area and control the PT between the WLs—part of read and RAC improvement.
Some advantages of this embodiment (double PI) are:
it is a simple process
it provides good secondary electron generation and injection
it results in a smaller Vt distribution
it has better Lpi<Le due to 2nd & 3rd knobs (deep PI & APT)
Some disadvantages of this embodiment (double PI) may be:
it has a lower breakdown due to deep PI Example 2

Vt Implant and PI

FIG. 7 illustrates an NROM memory cell 700 (compare 600) having Vt implants (Vt #1, Vt #2, Vt #3) and a single (rather than double) pocket implant (PI-1, PI-2).

Generally, the cell 700 (compare 300) comprises two spaced-apart diffusions 714 and 716 (compare 314 and 316) in a substrate 712 (compare 312), a channel 720 (compare 320) between the two diffusions, and an ONO stack comprising bottom oxide 722 (compare 322), nitride 724 (compare 324) and top oxide 726 (compare 326) disposed above the channel 720 and slightly wider than the channel 720 (slightly overhanging the diffusions 714, 716). The gate (polysilicon word line (WL) is omitted, for illustrative clarity (see 322, FIG. 3).

The diffusions 714 and 716 function as source and drain (or drain and source, depending on what operation is being performed on which bit storage area, as described hereinabove), and may also be referred to as bitline diffusions, since they typically are the bitline diffusions. In this figure, the left bit line diffusion 714 acts as the source and the right bit line 716 diffusion acts as the drain, for a programming operation of inserting electrons into the right bit storage area (compare 323, FIG. 3). Conversely, the right bit line diffusion 716 acts as the source and the left bit line diffusion 714 acts as the drain, for a programming operation of inserting electrons into the left bit storage area (compare 321, FIG. 3).

The polarity illustrated here is "n-channel", meaning that the memory cell transistor structure is formed in (and atop) a cell well (CW) which is doped with an electron acceptor such as boron. The opposite polarity, and using secondary hole injection would work (but is not effective) and is deemed to be included in this disclosure, for completeness.

A shallow pocket implant (PI-1) is formed close to the surface of the substrate for the purpose of retention after cycling (RAC) optimization and for $2^{nd}$ bit optimization. There is one of the shallow pocket implants 734 next to (adjacent, abutting) the diffusion 714, and there is one of the shallow pocket implants 736 next to (adjacent, abutting) the diffusion 716.

The shallow pocket implants 734, 736 of this embodiment (FIG. 7) may be substantially identical to the shallow pocket implants 634, 636 of the previous embodiment (FIG. 6)

The shallow pocket implants 734, 736 may comprise boron (or indium, or combinations thereof), implanted at 60 Kev, with a dosage of $1.5 \times 10^{13}$ per $cm^2$ and at an angle of 25-degrees to the right and left of vertical.

The shallow boron pocket implants PI-1, when implanted with relatively high energy, enhance the field in the substrate 812 and hence, enhance the probability M2 of secondary electron generation. This higher boron concentration is also effective in accelerating secondary electrons and hence, enhances their probability T of injection.

This example generally has the same goals as the previous (FIG. 6) example. The shallow pocket implants play the same role as in the previous example. However, in this example, instead of a second, deep pocket implant PI-2 being formed, Vt implants are used to enhance secondary electron generation.

Vt implants are a known tool in the designer's toolbox, and may be performed after ONO, after gate oxide, and use very little of the thermal budget.

In this example, three Vt implants are shown, as follows.

A first Vt implant Vt #1 is low boron concentration, such as $5\text{-}10 \times 10^{12}/cm^2$ boron (or indium), and extends from (substantially) the surface of the substrate 712 to a first depth (d1), such as (approximately) ¼ or ⅓ of the junction (or diffusion) depth (comparable to the shallow pocket implant) below the surface of the substrate. (The junction depth is typically 80-100 nm.) The purpose of the first Vt implant Vt #1 is generally the same as the shallow implant 636, and it may be used either in conjunction with a shallow pocket implant or in lieu thereof (as a substitute therefore).

A second Vt implant Vt #2 is a higher boron concentration, such as $1\text{-}5 \times 10^{13}/cm^2$ boron (or indium), and extends from the first Vt implant Vt #1 (in other words, from d1) to a second depth (d2), such as ½ of the junction (or diffusion) depth below the surface of the substrate. The second Vt implant Vt #2 may be omitted, and serves simply to provide a transition from the first Vt implant Vt #1 to the third Vt implant Vt #3. If Vt#2 is omitted, its function may be taken up by the background concentration in the CW.

A third Vt implant Vt #3 is a yet higher boron concentration, such as $1\text{-}5 \times 10^{13}/cm^2$ boron (or indium), and extends from second Vt implant Vt #2 (in other words, from d2) to a third depth (d3), such as 100 nm below the surface of the substrate. Vt #3 extends from about one half of the junction depth (if there is Vt #2) to the bottom of the junction, or beyond. If Vt#2 is omitted, Vt#3 commences from the bottom of Vt#1 to the bottom of the junction.

The third Vt implant Vt #3 may be regarded as a "replacement" for the second, deep pocket implant (PI-2) of the previous embodiment, and creates the conditions for enhancing secondary electron generation and serves as the bulk PT prevention during erase.

The positioning of the third Vt implant Vt #3 is comparable to that of second, deep pocket implant (PI-2) of the previous embodiment, generally adjacent the bottom half of the bitline diffusion, and can extend under the bitline diffusion.

The third Vt implant Vt #3 may be regarded as better than the second, deep pocket implant (PI-2) of the previous embodiment because rather than guessing the exact potential distributions within the channel, with Vt #3 good conditions for the secondary generation are created everywhere in this band. Although not all of the holes (h2) are going to take the same path, they will all pass though Vt #3. In contrast to the second, deep pocket implant (PI-2) of the previous embodiment, Vt #3 provides a much simpler way to create the correct boron concentrations As mentioned above, Vt #2 may be omitted, the main purpose of Vt #2 being to provide a "knob" to optimize the transition between Vt #1 and Vt #3. (A "knob" is a way to adjust something, so you have another parameter that you can optimize your profiles better.)

In this example, the background is low CW so that there is the option for the Vt implants For example, the cell well (CW) has a background concentration of approximately $1.0 \times 10^{17}/cm^3$ boron. Note that the background CW concentration is slightly lower in this embodiment (FIG. 7) than in the previous embodiment (FIG. 6).

The channel 720 has an effective length Leff. As illustrated in FIG. 7, Lpi is the length of the shallow pocket implant diffusion PI-1, and Le is the length (referred to as "width") of the electron distribution resulting from secondary injection. In the figure, the electron distribution is shown by the curve 730 (dashed lines). This is generally the same result accruing from the previous embodiment (FIG. 6).

The idea being illustrated here is that the electron distribution Le is wider (longer) than the boron distribution Lpi (Lpi<Le), thereby reducing sensitivity (during read) to those electrons that are very far from the junction.

The following dimensions are exemplary:
the bottom oxide layer 722 may be from 3 to 6 mm, for example 4 nm thick
the middle nitride layer 724 may be from 3 to 8 nm, for example 4 nm thick
the top oxide layer 726 may be from 5 to 15 nm, for example 10 nm thick
depth of the bitline diffusions 814, 816: approximately 50 nm (commencing at the surface of the substrate 712)
length (Leff) of the channel 720: approximately 80 nm (in 60 nm technology cells)
length (Lpi) of the shallow pocket implant PI-1: approximately 15 nm width (Le) of electron distribution: approximately 20 nm depth of the shallow pocket implant PI-1: approximately ⅓ to ½ of the depth of the bitline diffusions (commencing at the surface of the substrate 712)

depth of the Vt implants-discussed hereinabove.

Advantages of this embodiment may include:

it is a simple process it provides good Secondary Injection

Vt distribution is improved over current techniques, and is less PI dependent

Better Lpi<Le due to $2^{nd}$, 3rd & 4th knobs (deep PI, APT &Vt implants)

Disadvantages of this embodiment may include:

Lower breakdown due to deep PI

This embodiment utilizes:

Very Low CW to leave the option for the Vt implants.

Vt#1—surface low dose.

Vt#2—surface higher dose (most likely will be skipped)

Vt#3—Higher dose for secondary generation and improved deep PT.

PI—to improve 2nd bit.

APT—Increase secondary outside the channel area, control the PT between the WLs & improve 2nd bit.

The Total Process Flow

Techniques for forming a shallow pocket implant (such as 634, 626 and 734, 736) self-aligned to a bit line junction are well known, as are techniques for forming threshold voltage implants (such as Vt #1, Vt #2, Vt #3), and require no significant discussion herein. See, for example, U.S. Pat. No. 6,215,148, and U.S. Pat. No. 6,429,063.

Techniques for forming a deep pocket implant are also known. See, for example, US Published patent application No. 20060084219 which discloses an exemplary pocket implant such as of boron (may be using Boron Fluorine BF2), or of indium, or compounds or alloys containing boron and/or indium, and a process for implanting it.

Conclusion

This disclosure explains how secondary electron injection (SEI) can be a viable injection mechanism for NROMs, and represents what amounts to a revolution in thinking, and a very simple implementation. A number of patents have been referenced above illustrative of the notion that secondary electron injection is something to be avoided, and designed around, for NROMs. (In contrast with floating gate cells, where the exact location of electron injection in the charge storage medium is not important.)

The first "revelation" is that you can go to such a low Vg (Vwl) that, from the beginning of the injection, and definitely after a given delta Vt, you may find yourself with what an opposing field in the gate—opposing to electron injection, which, under conventional thinking, means that you cannot program.

The second "revelation" is that by reducing Vg (Vwl) you can control the width of the electron distribution to be narrower, rather than wider as had previously been thought.

In addition to and supportive of this is:

the shallow implant that helps with read.

the deep pocket implant (or Vt implants) that helps in the efficient creation of secondary electrons (whereas, previously, this was a situation sought to be avoided).

the understanding that you cannot just increase the shallow pocket implants to whatever level you want for the read improvement, because of the RAC limitations.

The purpose of the third Vt implant Vt #3 and the deep pocket implant (PI-2) are to enhance (increase, numerically) the probability (M2) of generating secondary electrons (e3) for secondary electron injection (SEI). A low (negative) Vsub enhances (increases, numerically) the probability (T) of secondary electron injection. Applying a low Vwl (Vg) does not increase (numerically) secondary injection, but nevertheless enhances it (qualitatively) by controlling (narrowing) electron distribution, as described hereinabove. The low Vwl (Vg) also serves to substantially reduce (suppress) or eliminate channel hot electron (CHE) injection. (Generally, Vg (Vwl) is insufficient to support CHE injection.)

This disclosure illustrates that injection of electrons into the charge storage areas of NROM cells can successfully be realized using secondary electron injection as the principal injection mechanism (during a given operation, such as single- or multi-level cell programming using electron injection), while channel hot electron injection is substantially suppressed (including 0). In numerical terms, during a programming step, the preponderance of the electrons which are injected into the charge storage area of the NROM cell will be secondary electrons (e3) rather than channel hot (or "primary") electrons (e1). A ratio of secondary electrons (e3) to primary electrons (e1) is up to at least 99:1 (99% secondary electrons), including the following:

substantially 100% secondary electrons;

approximately 99% secondary electrons;

approximately 80% secondary electrons approximately 65% secondary electrons approximately 50% secondary electrons approximately 35% secondary electrons at least 98:1 (98% secondary electrons);

at least 95:1 (95% secondary electrons);

at least 90:1 (90% secondary electrons); and at least 2:1 (50% secondary electrons).

The numbers above include (imply) their corollaries, for example, substantially 100% SEI implies substantially 0% CHE, approximately 99% SEI implies approximately 1% CHE, and so forth.

Graphs and Charts

In the provisional application ("provisional"), upon which this patent application is based, may appear a number of foils (at pages 10-17) which illustrate the validity of the concepts set forth herein. They may be based on simulations and/or experiments, and it should be understood that they are presented in the provisional, and discussed briefly herein, simply to aid in an understanding, without prejudice.

Provisional Page 10, Entitled "2. Secondary Patent Description—Reduced Vwl"

The left-hand graph, entitled "Programming vs. Split", illustrates that, as gate voltage Vg (which, for purposes herein is equivalent to wordline voltage Vwl) is reduced (from Vg=Vt+7.5 V to Vg=Vt+2 V), during programming, the drain potential (Vdp) needs to be increased. This illustrates that by just (only) reducing the gate voltage (Vg, or Vwl) in programming, this actually increases the necessary programming voltages, which is contrary to the stated (above) objective of reducing programming voltages (and currents). This is an expected result.

The right-hand graph, entitled "2nd Bit Effect", illustrates that by taking advantage of Vsub, despite low Vg, programming voltages can be low. This illustrates that as you decrease from a high Vg=Vt+7.5 V until a low Vg=Vt+3 V there is no real trend, but when you go to a lower voltage (Vg=Vt+2 V) the second bit effect goes up dramatically, and this is also an expected result.

Next it will be shown how the teaching of this disclosure provide a mechanism to reduce Vg, without increasing programming voltage, and without getting into trouble with 2nd bit effect.

Provisional Page 11, Entitled "2. Secondary Patent Description—Reduced Vwl"

The graph, entitled "Programming vs Vd", illustrates that, as Vsub is reduced, below zero, programming voltages can be reduced, for both high and low Vg, with a resulting desirable decrease in programming voltage and narrow electron distribution (Le).

Increasing Vsub (to be more negative), and reducing Vwl can result in very low Vbl. the reduction in Vbl is due to:
1. secondary injection—total accelerating voltage Vbl-Vsub
2. Lower Iprog, therefore less voltage (IxR) drop due to bitline resistance Provisional Page 12, Entitled "2. Secondary Patent Description—Reduced Vwl"

The graph, entitled "Programming vs. Split", is comparable to Page 11, and illustrates that both high and low Vg benefit from the negative bulk voltage (Vb, Vsub), in terms of the programming voltages.

This graph illustrates a very high dependence of programming speed on Vsub. Therefore, a Vsub reduction of −2 V translates into a 1.3 V reduction in Vdp (Vt+3 V).

Provisional Page 13, Entitled "2. Secondary Patent Description—Reduced Vwl"

The graph, entitled "2nd Bit Effect", illustrates that increasing Vsub, for either high or low Vg, deteriorates the 2nd bit effect. (Conversely, lowing Vsub is advantageous for avoiding 2nd bit problems.) Also, as Vg increases from low (V5+3 V to high (Vt+7.5 V), the second bit problem gets worse. In other words, having low Vg (Vwl) and negative Vsub (Vb) are shown to be beneficial regarding 2nd bit effect.

This graph illustrates that a negative Vsub can have a worse 2nd bit effect, and that having a higher Vg can result in a wider electron distribution (Le) and a worse 2nd bit effect.

Provisional Page 14, Entitled "2. Secondary Patent Description—Reduced Vwl"

The graph, entitled "ONO effect on 2nd bit", illustrates what appears to be the effect of the ONO thicknesses on 2nd bit effect, using secondary injection. What it is really showing is that by optimizing the conditions, inside the silicon, you can improve your secondary (SEI) 2nd bit to be almost identical to that of non-secondary (CHE) injection.

Thus, reduced Vg and negative Vsub provides low programming current, then by optimizing the cell implants (as described hereinabove), the delta between the primary and secondary injection can almost be eliminated from a 2nd bit point of view.

This graph indicates that a thicker nitride (6 nm) shows the best 2nd bit effect, which is stronger in secondary injection conditions than with CHE.

Provisional Page 15, Entitled "2. Secondary Patent Description—Reduced Vwl"

The graph, entitled "Programming vs. Split" illustrates that when the device is scaled, when Vsub=0, the longer drawn dimension (Ld) the programming voltages go up. In the secondary, the sensitivity to the drawn dimension Ld is smaller than in the case of the non-secondary (CHE).

This graph shows that the effect is confirmed over a wide range of channel lengths (Ld), and that secondary programming is not sensitive to Leff (and, is scalable).

Provisional Page 16, Entitled "2. Secondary Patent Description—Reduced Vwl"

The graph, entitled "Id vs Vd", illustrates an example of expected programming current (Id). Assuming a Vt window of 1.5 volts (from Vg=Vt+2.25 V to Vg-Vt+3.75 V, with the high Vt corner, the programming current is extrapolated to be 7 µA (microamps), 15 µA, 22 µA. When moving from (for example) a 70 nm technology (device) to 50 nm, all of these number should scale by approximately ⁵⁄₇.

This represents a 5-fold (5×), or more, improvement in programming current Iprog, based solely on choice of Vwl.

Results such as the following can be obtained (when using low Vwl):
for low Vt cells, Ipgm~22 µA
for high Vt cells, Ipgm~7 µA
for a typical case (center of distribution), Ipgm~5 uA which represents a manifold (5× or more) improvement (reduction) in programming current (Iprog) required.

Generally, the improvement in programming current (Iprog) which can be obtained by using secondary injection (SEI) and the techniques set forth herein is at least 1.5-10× lower than for CHE, including at least 1.5× lower, 2× lower, at least 3× lower, at least 4× lower, at least 5× lower, at least 6× lower, at least 7× lower, at least 8× lower at least 9× lower, and at least 10× lower.

Provisional Page 17, Entitled "2. Secondary Patent Description—Reduced Vwl"

The graphs on this page, entitled "Id & Isub vs Vd" and "Isub to Id Ratio vs Vd", illustrate investigations into substrate current (Isub) taking into consideration that the negative Vsub has to be supplied by the on-chip power supplies.

As illustrated, substrate current (Isub) in programming is very low. For example:
for Vds=3.5 V, the ratio of Isub:Id is ~1/50
the maximum average Isub=2× for a programmed cell. Iprog=15 µA/25=~0.5 µA
for Vds=3.0 V, the ratio of Isub:Id is ~1/200
minimum average Isub=1× for an erased cell. Iprog=15 µA/200=~0.1 µA While a number of exemplary aspects and embodiments have been discussed above, those of skill in the art will recognize certain modifications, permutations, additions and sub-combinations thereof. It is therefore intended that the following appended claims and claims hereafter introduced be interpreted to include all such modifications, permutations, additions and sub-combinations.

What is claimed is:

1. A method of injecting electrons into charge storage areas of a non-volatile memory (NVM) cell comprising an ONO layer, the method comprising:
   utilizing secondary electron injection (SEI) to perform a given electron injection operation, and
   wherein a threshold voltage (Vt) for the cell is defined, and further comprising:
   applying a gate voltage (Vg) of approximately Vt+3 V during the operation.

2. The method of claim 1, wherein:
   the NVM cell is a nitride read only memory (NROM) cell.

3. The method of claim 1, wherein:
   the given electron injection operation is programming at least one charge storage area of the cell.

4. The method of claim 1, further comprising:
   enhancing secondary electron injection (SEI) while substantially reducing channel hot electron (CHE) injection during the given electron injection operation.

5. The method of claim 1, wherein:

SEI accounts for at least 65% of the electrons injected into a selected one of the charge storage areas of the cell during the given electron injection operation.

6. The method of claim 1, further comprising:

applying a gate voltage (Vg) which is sufficiently low that CHE is substantially eliminated.

7. The method of claim 1, wherein:

Vt is approximately +1.8 volts.

8. The method of claim 1, further comprising:

applying a source voltage (Vs) of approximately 0;

applying a drain voltage of approximately 3.0-4.5 volts; and applying a substrate voltage (Vb) of approximately 0 to −2 volts.

9. The method of claim 1, further comprising:

applying a substrate voltage (Vb) of approximately 0 to −2 volts.

10. A method of injecting electrons into charge storage areas of a non-volatile memory (NVM) cell comprising an ONO layer, the method comprising:

utilizing secondary electron injection (SEI) to perform a given electron injection operation, and further comprising:

injecting the electrons into charge storage areas which are above two bitline diffusions defining the cell; and constructing the cell so that a read mechanism is insensitive to electrons injected far from the diffusion.

11. The method of claim 10, wherein the charge storage areas are located above bitline diffusions defining the cell, and further comprising:

implanting shallow pocket implants (PI-1) in the channel, adjacent the diffusions.

12. The method of claim 11, wherein:

the shallow pocket implants comprise boron (or indium, or combinations thereof).

13. The method of claim 11, further comprising:

implanting the shallow pocket implants at a dosage of approximately $1.5 \times 10^{13}$ per $cm^2$ at 60 KeV and at an angle of 25-degrees to the right and left of vertical.

14. A method of injecting electrons into charge storage areas of a non-volatile memory (NVM) cell comprising an ONO layer, the method comprising:

utilizing secondary electron injection (SEI) to perform a given electron injection operation, and further comprising:

implanting a first threshold voltage implant (#1) shallow in the channel.

15. The method of claim 14, wherein:

the first threshold voltage implant (#1) extends from substantially the surface of the substrate to a first depth (d1) below the surface of the substrate.

16. The method of claim 14, wherein:

the first depth is approximately ¼-⅓ of a junction depth below the surface of the substrate.

17. The method of claim 16, wherein:

the junction depth is 80-100 nm.

18. The method of claim 14, wherein:

the first threshold voltage implant (#1) has a low boron concentration, such as $5\text{-}10 \times 10^2/cm^2$ boron.

19. A method of injecting electrons into charge storage areas of a non-volatile memory (NVM) cell comprising an ONO layer, the method comprising:

utilizing secondary electron injection (SEI) to perform a given electron injection operation, and wherein the NVM cell is disposed in a substrate, and further comprising:

providing means for enhancing generation of secondary electrons (e3) deep in the substrate.

20. The method of claim 19, wherein:

the means for enhancing generation of secondary electrons (e3) comprises a deep pocket implant (PI-2) formed deep within the substrate.

21. The method of claim 20, wherein:

the deep pocket implant comprises boron.

22. The method of claim 20, wherein:

the deep pocket implant is formed with a dose of $0.5\text{-}6 \times 10^{13}/cm^2$ at an angle of 0-15.degree. and energy of 10-20 Kev.

23. The method of claim 20, wherein:

the deep pocket implant is located approximately beneath a corresponding shallow pocket implant, spaced apart from both the shallow pocket implant and the diffusion.

24. The method of claim 20, wherein:

the deep pocket implant extends from approximately half a depth of the bitline diffusion to at least the depth of the bitline diffusion.

25. The method of claim 19, wherein:

the means for enhancing generation of secondary electrons (e3) comprises a Vt implant (Vt #3) formed deep within the substrate.

26. The method of claim 25, wherein:

the Vt implant (Vt #3) comprises boron.

27. The method of claim 25, wherein:

the Vt implant (Vt #3) is formed with a dose of $1\text{-}5 \times 10^{13}/cm^2$.

28. The method of claim 25, wherein:

the charge storage areas are located above two bitline diffusions defining the cell; and the Vt implant (Vt #3) is located approximately beneath a shallow pocket implant, spaced apart from both the shallow pocket implant and the diffusions.

29. The method of claim 25, wherein:

the charge storage areas are located above two bitline diffusions defining the cell;

and the Vt implant (Vt #3) extends from approximately half a depth of the bitline diffusion to at least the depth of the bitline diffusion.

30. A method of injecting electrons into charge storage areas of a non-volatile memory (NVM) cell comprising an ONO layer, the method comprising:

utilizing secondary electron injection (SEI) to perform a given electron injection operation, and wherein:

the NROM cell is formed in a cell well having a background concentration of approximately $1.0\text{-}1.5 \times 10^{17}/cm^3$ boron (or indium).

31. The method of claim 30, wherein:

the NROM cell is formed in a cell well having a background concentration of approximately $1.0 \times 10^{17}/cm^3$ boron.

* * * * *